(12) United States Patent
Takahashi et al.

(10) Patent No.: US 8,081,394 B2
(45) Date of Patent: Dec. 20, 2011

(54) INFORMATION RECORDING APPARATUS AND METHOD, INFORMATION REPRODUCING METHOD AND FADE-IN MEMORY, WITH SUMMARY INFORMATION CORRESPONDING TO PLURALITY OF INFORMATION RECORDING ELEMENTS

(75) Inventors: Migaku Takahashi, Miyagi (JP); Masakiyo Tsunoda, Miyagi (JP); Shin Saito, Miyagi (JP); Tomoyuki Ogawa, Miyagi (JP); Itaru Fujimura, Kanagawa (JP); Shigeyoshi Misawa, Tokyo (JP); Toshiyuki Kawasaki, Kanagawa (JP)

(73) Assignees: Ricoh Company, Ltd., Tokyo (JP); Tohoku University, Sendai-shi, Miyagi (JP)

(*) Notice: Subject to any disclaimer, the term of this patent is extended or adjusted under 35 U.S.C. 154(b) by 0 days.

(21) Appl. No.: 12/890,010

(22) Filed: Sep. 24, 2010

(65) Prior Publication Data

US 2011/0007582 A1    Jan. 13, 2011

Related U.S. Application Data

(62) Division of application No. 11/730,338, filed on Mar. 30, 2007, now Pat. No. 7,826,174.

(30) Foreign Application Priority Data

Mar. 31, 2006 (JP) ................................ 2006-097573
Mar. 31, 2006 (JP) ................................ 2006-097583

(51) Int. Cl.
*G11B 5/02* (2006.01)
*G02B 6/10* (2006.01)
*G01N 21/55* (2006.01)
*G01J 3/44* (2006.01)
*G11C 8/00* (2006.01)

(52) U.S. Cl. .......... 360/22; 356/301; 356/445; 385/129; 385/131; 365/145; 365/241; 365/243.5; 360/27; 360/101

(58) Field of Classification Search .................. None
See application file for complete search history.

(56) References Cited

U.S. PATENT DOCUMENTS

| 4,992,891 | A * | 2/1991 | Komatsu et al. ............. 386/287 |
| 6,407,972 | B1 * | 6/2002 | Koyata et al. .................. 369/83 |
| 7,193,719 | B2 | 3/2007 | Meehan et al. |

(Continued)

FOREIGN PATENT DOCUMENTS

JP    2004-164818    6/2004

(Continued)

OTHER PUBLICATIONS

Matsuyama et al., "Future Prospects and Technological Issues of Magnetic Random Access Memory (MRAM)", MRAM vol. 69, No. 9, pp. 1074-1079, 2000.

(Continued)

*Primary Examiner* — A. J. Heinz
(74) *Attorney, Agent, or Firm* — Dickstein Shapiro LLP

(57) ABSTRACT

An information recording apparatus has a plurality of fine particles forming an array on a plane in close proximity of each other, each of the plural particles including a ferromagnetic metal, a light-emitting device for exciting a near-field light, and a photo-electric conversion element for detecting a near-field light traveled along the fine particles. Summary information may be recorded for plural information recording parts.

9 Claims, 18 Drawing Sheets

U.S. PATENT DOCUMENTS 7,472,069 B2 * 12/2008 Takagi et al. ................. 704/503
7,529,454 B2 5/2009 Hyde et al.

FOREIGN PATENT DOCUMENTS

JP 2004-306404 11/2004
JP 2005-294376 10/2005

OTHER PUBLICATIONS

Yagami et al., "Research Trends in Spin Transfer Magnetization Switching", J. Magnetic Soc. Japan, vol. 28, No. 9, pp. 937-948, 2004.

Naito, "2.5-Inch-Disk Patterned Media Prepared by Means of Self-Assembling Nano-Dot Structures" J. Magnetic Soc. Japan, vol. 27, No. 3, pp. 101-105, 2003.

Asakawa et al., "Fabrication of Subwavelength Structure for Improvement in Light-Extraction Efficiency of Light-Emitting Devices Using a Self-Assembled Pattern of Block Copolymer" Applied Optics, vol. 44, No. 34, pp. 7475-7482, Dec. 1, 2005.

Jeyadevan et al., "Chemical Synthesis of High Coercivity Magnetic Nanoparticles" J. Magnetic Soc. Japan, vol. 28, No. 8, pp. 896-905, 2004.

Takemoto et al., "Non-Classical Photon Emission from a Single InAs/InP Quantum Dot in the 1.3-µm Optical-Fiber Band" Japanese Journal of Applied Physics, vol. 43, No. 7B, pp. L993-L995, 2004.

V.G. Veselago, "Electrodynamics of Substances with Simultaneously Negative Electrical and Magnetic Permeabilities" Soviet Physics Uspekhi, vol. 10, No. 4, 509, pp. 7-13, 1968.

J.B. Pendry, "Negative Refraction Makes a Perfect Lens" Physical Review Letters, vol. 85, No. 18, pp. 3966-3969, Oct. 30, 2000.

Chui et al., "Theoretical Investigation on the Possibility of Preparing Left-Handed Materials in Metallic Magnetic Granular Composites" Physical Review B, vol. 65, pp. 144407-1-144407-6, 2002.

V.G. Veselago, "Electrodynamics of Substances with Simultaneously Negative Electrical and Magnetic Permeabilities" Soviet Physics Uspekhi, vol. 10, No. 4, pp. 509-514, 1968.

* cited by examiner

INFORMATION RECORDING APPARATUS AND METHOD, INFORMATION REPRODUCING METHOD AND FADE-IN MEMORY, WITH SUMMARY INFORMATION CORRESPONDING TO PLURALITY OF INFORMATION RECORDING ELEMENTS

CROSS-REFERENCE TO RELATED APPLICATION

This application is a divisional of application Ser. No. 11/730,338, filed Mar. 30, 2007, now U.S. Pat. No. 7,826,174, the entirety of which is incorporated herein by reference.

BACKGROUND OF THE INVENTION

The present invention relates to magnetic recording medium that uses near-field optics in combination with nano-structure fine particles that contain a ferromagnetic metal. Further, the present invention relates to an information recording apparatus capable of recording huge amount of information and a method for reproducing information from such an information recording apparatus of huge storage capacity.

With increase in the amount of information handled in human society, recording density of recording media is increasing sharply in memory systems used for storing information. In the art of magnetic recording, recording capacity of the order of TB (terabytes)/inch$^2$ is expected to be realized soon in the form of magnetic disks.

The amount of information of the world has already reached the order of exabytes ($10^{18}$ bytes), and processing of information of this amount is expected to become the matter of everyday life by the decade of the year 2020 even for individual persons. In corresponding to this, it is expected that there should be realized the use of storage device of petabyte recording capacity having the recording density of 1 peta bpi by the latter half of the decade of the year 2020. In fact, there are already marketed home video recorders having the storage capacity of 1 terabytes in the year 2005, wherein this apparatus combines a HDD (hard disk drive) with DVD (digital versatile disk).

Thus, the foregoing prediction is thought not unrealistic as the prediction for the milestone twenty years later.

Judging from the recording time of 2 hours of current DVD recorders that record the information of 4.7 Gigabytes, the recording capacity of 1 petabyte should be the capacity capable of holding the pictures of whole life of one person of fifty years. Thus, by simple extrapolation of two-dimensional recording density from the current recording size of 25.4× 25.4 nm$^2$ realized for the case of the recording density of 1 tera bps, it is expected that the recording size should become 0.8×0.8 nm$^2$ for the case of 1 peta bps, while this size corresponds to the size of only sixty four atoms of atomic diameter of 0.1 nm.

Thus, for achieving the recording density of 1 peta bpsi, nano-fabrication technology becomes the key, while development of nano-fabrication technology is in progress in the field of optical memories in relation to the use of near-field light. Thus, nano-technology is thought to become more and more important in this field. Further, associated with such development of nano-fabrication technology, development of new functional materials is also expected from novel nano-structures.

The technology of information recording is a comprehensive technology spanning over the extensive field of device technology, mechanics and system technology, and technological development has to be made by taking a balance between all these aspects. Arguments directed only to the materials or arguments directed only to the devices are not futile for developing the technology for practical application. Further, there is needed thorough and essential examination and breakthrough on the aspect of systems as to how to take out signals from a nanoscopic system to the macroscopic system. This includes breakthrough with regard to reproducing speed.

Thus, with the development of storage device of petabyte class, there are needed the elemental technologies of: high-sensitivity reading of information; electronic or electric-field reproducing of input light, stabilization of the state of minute regions, formation of nano-cells, prevention of migration, formation of protective layers, and the like, in terms of the conceptual technology. Further, there are needed elemental technologies of: miniaturization processing; pattern transfer; access control, and the like, in terms of the functional technology.

With the information recording medium of peta byte class, investigations should be made toward solid state construction of optical memories (as in the case of the information recording and reproducing apparatuses implemented in the form of semiconductor flash memories) by using nano-phonetic devices relying on the concept of nano-photonics, in combination with the technology of forming an integrated circuit. While semiconductor memories suffer from heating with increase of storage capacity, such a limitation imposed by heating can be overcome by integrating the semiconductor memory with a nano-photonic semiconductor memory that is operated by near-field light.

Toward materialization of the ultra-high density recording medium of petabyte class, investigations are being made for increasing the recording density to sub-peta bpsi by constructing a novel recording medium in anticipation of transition of the read/write technology to high spatial resolution and ultra high-speed, starting from the recoding medium having the recording density of super tera-bpsi, in which mono-domain magnetic crystal particles (spin nanocluster) free from magnetic domains that become the cause of noise or unstable operation, are aligned in order, and by decreasing the particle size step by step.

Ultimate goal is to attain further large capacity by controlling the spin of individual atoms based on the novel principle that uses photon-electron spin interaction.

So far, various information recording apparatuses and memory systems are developed such as semiconductor memories formed by semiconductor logic devices, magnetic memories such as magnetic disks, magnetic tapes, magnetic bubble memories, and the like, or optical media such as optical disks including Compact Disks and Digital Versatile Discs or optical cards. For a solid state magnetic memory, there is proposed a MRAM (magnetic random access memory). Reference should be made to Non-Patent Reference 1. Further, there is known the phenomenon of magnetic switching caused by spin transfer torque and there is proposed an MRAM that uses this principle (Non-Patent Reference 2).

Non-Patent Reference 1

Matsuyama, K., Future Prospects and Technical Issues of Magnetic Random Access Memory (MRAM), Ouyou Buturi Vol. 69, No. 9, 2000, pp. 1074-1079

Non-Patent Reference 2

Yagami, K., et al., Research Trends in Spin Transfer Magnetization Switching, J. Magnetic Soc. Japan, Vol. 28, No. 9, 2004, pp. 937-948.

Non-Patent Reference 3

Naito, K., et al., 2.5-inch-disk patterned media prepared by means of self-assembling nano-dot structures. J. Magnetic Soc. Japan, Vol. 27, No. 3, 2003, pp. 101-105.

Non-Patent Reference 4

Koji Asakawa, et al., Fabrication of subwavelength structure for improvement in light-extraction efficiency of light-emitting devices using a self-assembled pattern of block copolymer, Appl. Opt. Vol. 44 No. 34 2005 pp 7475-7482

Non-Patent Reference 5

B. Jeyadevan, et al., chemical synthesis of high coercivity magnetic nanoparticles, J. Magnetic Soc. Japan, Vol. 28, No. 8, 2004, pp. 896-905

Non-Patent Reference 5

Takemoto, K., et al., non-classical photon emission from a single InAs/InP quantum dot in the 1.3-μm optical-fiber band, J. J. Appl. Phys. Vol. 43 No. 7B 2004, pp. L993-L995

Non-Patent Reference 7

Veselago, V. G., the electrodynamics of substances with simultaneously negative values of $\in$ and μ (online), Soviet Physics Uspekhi Vol. 10, No. 4, 509 (1968) (search made on Mar. 29, 2006) for URL of http://www.turpion.org/php/paper.phtml?journal_id=pu& paper_id=3699

Non-Patent Reference 8

Pendry, J. B., negative refraction makes a perfect lens, Phys. Rev. Lett. Vol. 85, No. 18, 3966 (2000)

Non-Patent Reference 9

Chui S. T. et al., theoretical investigation on the possibility of preparing left-handed materials in metallic magnetic granular composites, Phys. Rev. B, Vol. 65, 144407 (2002)

SUMMARY OF THE INVENTION

With conventional magnetic memories such as an MRAM, information is recorded by controlling the direction of the magnetization formed in a magnetic recording material that contains a ferromagnetic material having magnetic domains, and because of this, there is a need of decreasing the size of the magnetic domains for increasing the recording density. With conventional MRAMs, electric current is caused to flow at the time of recording of information, and reproducing of the recorded information is achieved by detecting a change of the magnetic resistance caused by the switching of the magnetization. With such a construction, the degree of resistance change becomes small with device miniaturization, and it is expected that detection of information becomes difficult with further miniaturization.

Further, with increase of the recording density, it becomes necessary to provide a large number of complex interconnection patterns for accessing the information, while the problem of heat generation caused by the electric current flowing through the interconnection patterns or leakage current is no longer ignorable with increase in the integration density, and this also imposes difficulty for increasing the recording density.

Further, for realizing such ultra high-density memories of peta-byte class, mere increase of recording density is not sufficient, and reading and writing of information becomes also an important problem.

With the existing recording and reproducing systems of information such as HDD (hard disk drive) or ODD (optical disk drive) including (Blue Ray Disk or HD-DVD), recording and reproducing of information is achieved bit by bit, and thus, the data representing the information is converted to serial data at the time of recording or reproducing.

With such a construction, data transfer rate at the time of reproducing cannot exceed 1 Gbps because of the limitation imposed from the performance of the electric circuit. At the time of recording, there is needed a response time of the recording medium, and the signal transfer rate of recording information becomes slower than the case of reading information. Even when the parallel technology such as multiple head construction or simultaneous reading from plural layers is employed, the data transfer rate of 10 Gbps, which is ten times faster than the simple serial data transfer, is thought as a practical limit.

For example, suppose the case in which the reproducing rate of 1 Gbps is finally attained as a result of improvement of conventional reproducing circuit. Even with such a case, it takes about 12 days to reproduce the information of the capacity of 1 petabyte. Further, in the case of searching desired data by random accessing with such a construction, it takes about 6 days in average for retrieving the desired data, while such a device is far from practical use. Thus, the speed of searching and accessing has to be increased simultaneously with increase of the recording capacity at the time of such high-speed reproducing.

Thus, the present invention has a general object of solving the foregoing problems by improving the recording density and accessibility of information. More specifically, the present invention provides an information recording apparatus of increased recording density capable of reducing the problem of forming complex interconnections or heat generation caused by such complex interconnections and an information recording and reproducing method used therein.

In a first aspect, the present invention provides an information recording apparatus comprising: plural fine particles forming an array on a plane in close proximity of each other, each of said plural particles including a ferromagnetic metal; a light-emitting device for exciting a near-field light; and a photo-electric conversion element for detecting a near-field light traveled along said fine particles.

In another aspect, the present invention provides an information recording and reproducing method, comprising the steps of: exciting an oscillation mode of plasmon or near-field light in a part of fine particles each including a ferroelectric metal and arrayed in a plane with a minute distance and causing said oscillation mode to propagate through said fine particles; causing a change in said oscillation mode of plasmon by an orientation of magnetic moment of said ferromagnetic metal of said fine particles; and detecting a change of said oscillation mode of said plasmon and said near-field light in the vicinity of an end part of an array of said fine particles and reading out said change as recorded information.

According to the present invention, in which an oscillation mode of plasmon or near-field light is excited in a part of fine particles each including a ferroelectric metal and arrayed in a plane with a minute distance and in which the oscillation mode is caused to propagate along the fine particles, it becomes possible to read out the recorded information recorded in the array of the fine particles in the form of orientation of the magnetic moment of the fine particles, by detecting the change of the oscillation mode of the near-field light and the plasmon caused in the vicinity of the end part of the array of the fine particles. Thereby, it becomes possible to increase the recording density of the information while avoiding the problem of heat generation, or the like, caused when there are provided numerous complex interconnection patterns for improving the recording density and improving the accessibility of information.

Further, the present invention provides a fade-in memory capable of performing recording and reproducing of ultra large-scale data to and from a ultra large-scale information recording medium (fade-of petabyte order, and information recording method and reproducing method that uses such a fade-in memory.

Thus, according to the third aspect, the present invention provides a fade-in memory for recording and reproducing information to and from an information recording medium, comprising:

an information recording unit recording information to a plurality of information recording elements constituting said information recording medium;

an information reproducing unit reproducing information from said information recording elements;

an information summarizing unit summarizing information of plural information recording parts, each of said plural information recording parts including a plurality of said information recording elements; and a summary information recording unit recording therein a plurality of summary information summarized by said plural information summarizing units.

In a fourth aspect, the present invention provides an information recording method of a fade-in memory, said fade-in memory recording and reproducing information to and from an information recording medium, comprising the steps of:

recording information to a plurality of information recording elements constituting said information recording medium; and recording summary information summarizing said information recorded to said plural information recording elements, to a summary information recording unit provided for said plural information recording elements.

Further, according to a fifth aspect, the present invention provides an information reproducing method of a fade-in memory recording and reproducing information to and from an information recording medium, said information recording medium comprising a plurality of information recording parts each including a plurality of information recording elements, and a summary information recording unit recording summary information for each of said plural information recording parts, said method comprising the steps of:

acquiring summary information recorded into a summary information recording unit corresponding to a plurality of information recording elements;

selecting an information recording element based on said summary information; and reproducing information from said selected information recording element.

According to the present invention, it becomes possible to increase the recording density of ultra large-capacity recording medium of petabyte class, while simultaneously solving the problem of difficulty of retrieving and accessing information at the time of performing recording and reproducing of information with such ultra large-capacity information receding medium.

Storing information into a recording medium means that a physical property or state is held at a specific time in a specific location. Further, recording and reproducing of information can be defined as the operation that causes a desired change in such property (value or state) and to sense the state or change of the state.

Such recording and reproducing of information requires an apparatus that includes: a recording medium for recording the values of the properties; a probe for causing a change in the values of the properties or for detecting the values of the physical properties; a recording and reproducing device such as a pickup; and a device that carries out addressing. Further, there is needed a physical format defining what information should be recorded to what location at what time.

In the case of digital recording, a relationship is established between the properties or states and the logic values subjected to logic operation. For example, there is a need for the logic format like Boolean algebra that provides the rule over the Boolean divalent values (0, 1) or discrete n-bit logic values. In the case of analog recording, this is provided by analog values or states representing a physical quantity and the time change thereof.

At the time of recording, the elements of the information (essence of information) is recorded onto a recording medium with a format easy for recording such as the logic format of divalent logic values or n-bit discrete logic values. At the time of reproducing, it is necessary to provide a display unit that converts the information described by the logic format into the form capable of being recognized by human beings and display such converted information.

Here, consider the case of writing what a person has heard (information) on a piece of paper by using a pencil. The person may write down (record) the information on the paper along ruled lines formed thereon with Japanese or English language, which serves for the protocol.

Physically, thick and thin powders of carbon entangled with the fibers of the paper form a memory, while the powders on the paper form together a line, and the lines are combined with each other to represent a language. Thus, paper is a medium that functions as a memory and at the same time as a display.

In the case of semiconductor memories, particularly in the case of an SRAM, a flip flop circuit constructed by two transistors constitutes the fundamental unit of information, and logic value is recorded in the form of stable state in which one of the transistors is turned on and the other of the transistors is turned off. For the recording and reproducing device, data recording transistors are used, and addressing is achieved by word lines and bit lines.

With the information recording medium of the present invention (fade-in memory), it should be noted that the concept of fade-in (gradually remembering details) is essentially related to the information itself, and from this concept, the concepts of "detailed", "coarse", or the like, are derived in relation to the memory elements.

Thus, when the concept of fade-in is applied logically, it may be said that "the data array of this area is 010001101 when looked in detail, but when it is looked coarse, the data is approximately 0.4".

Now, this information value of "0.4" does not include any other information that is superior thereto, and it is not possible to form more detailed data this data alone. In order to remember the information gradually, it is necessary that the information is coded for fade-in retrieval.

Thus, with the present invention, the recorded information is organized into a hierarchical structure and there is provided a recording region for holding the hierarchical structure. At the time of reading, reading is made consecutively by starting from the information of the top hierarchy and summary information is used as substitute information when detailed information is not necessary.

In the case the recorded information is image information or motion picture information, there exists a relationship between a recording bit and an adjacent recording bit. In terms of spatial frequency, such information becomes the information having a large number of components in the relatively low frequency region with the slope of 1f (frequency).

The recording and reproducing method based on the concept of fade-in is particularly useful in the case of such image information.

More specifically, the values of adjacent pixels forming a block are averaged and the average value of the block thus obtained is recorded in a summary information recording region as summary information. At the time of reproducing, this summary information is read out at first as the value of the pixels. With this, coarse retrieval of the information is achieved. Thereafter, more detailed images are retrieved gradually.

Thus, in the foregoing process, only coarse information is read out when high-speed accessing and display are needed, while in the case more detailed information is needed, detailed information is read out by taking time. This is exactly the concept of fade-in.

Conventionally, there has been a need of displaying detailed information over the entire image with high resolution even in the case it is necessary to know only a part of the image in detail. Contrary to the foregoing, the fade-in memory of the present invention holds summary information for each block dividing the image region, and it is possible to provide the detailed display only for the regions where such detailed display is needed. As a result, high-speed display becomes possible.

The present invention realizes a storage apparatus of petabyte class by using a recording medium in which nano or sub-nanoparticles are aligned by self-organizing phenomenon, in combination with recording and reproducing process based on the concept of nano-photonics.

On the other hand, with such recording of enormous amount of information, hierarchical accessibility is a very important technology for practical use of the storage apparatus.

In conventional memory designing, reproducing of recorded information has been recognized as the problem of the drive system, while improvement of algorithm has been recognized as the problem to be undertaken by the side of information processing apparatus. However, with the storage apparatuses of petabyte class, technological breakthrough is demanded also for the access speed in view of tremendous increase of memory capacity.

For the breakthrough technology realizing transition from gigabyte class to terabyte class, attempts are already in progress for fusing optical technology with magnetic technology. In the case of realizing storage of petabyte class, however, there are needed additional novel technologies in addition to the foregoing, and the present invention attempts fusion of near-field optics with the technology of spin-cluster medium and semiconductor integration technology.

Further, for high-speed processing of the information of petabyte class, there is also the need of the software that controls the hardware carrying the aspect of recording and the software controlling the reading operation of the recorded information.

Thus, the present invention also provides a novel fade-in memory technology having the function of remembering detailed information gradually as the memory concept close to the information recognition process of human beings, by providing a redundant access function to the side of hardware.

DETAILED DESCRIPTION OF THE INVENTION

First Embodiment

Figure 1:
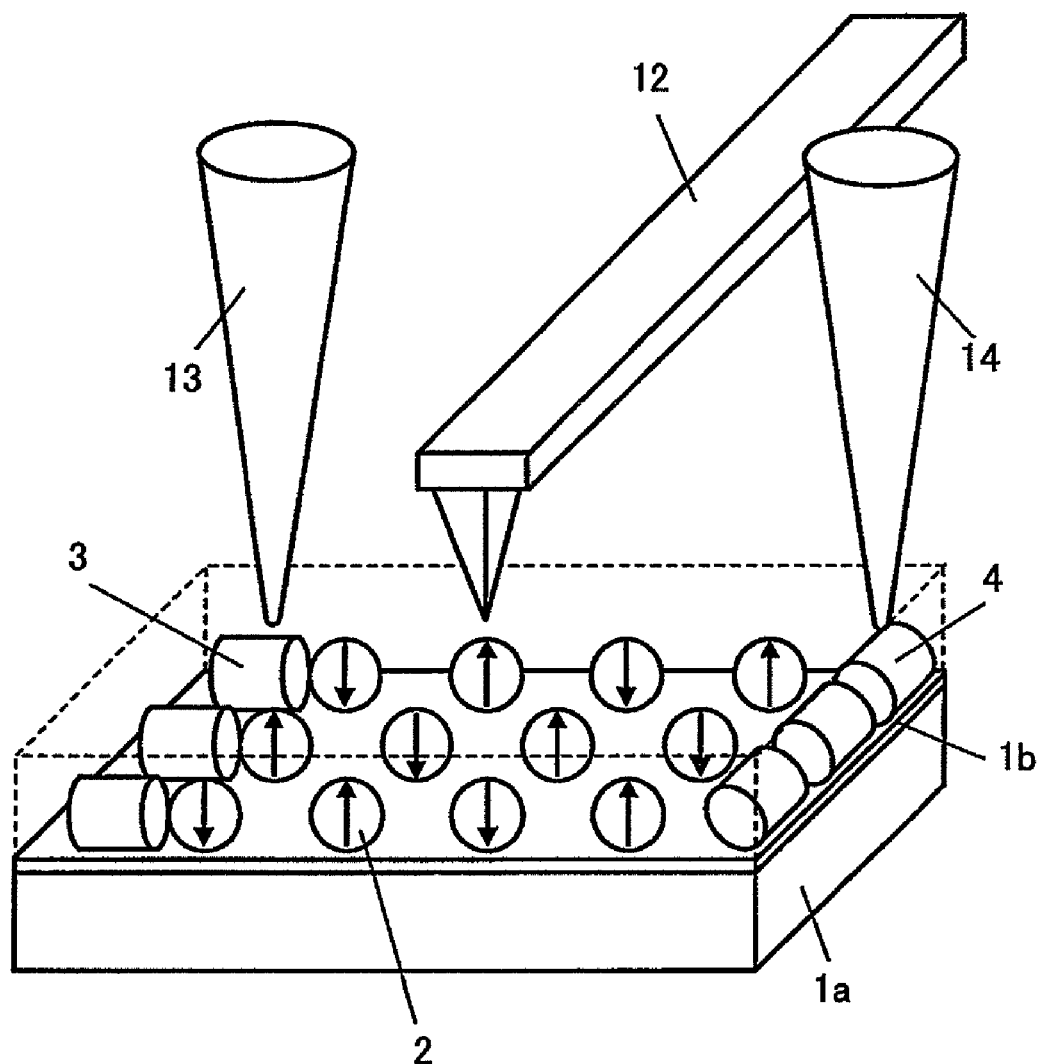
FIG. 1 is a diagram schematically showing the construction of an information recording apparatus according to a first embodiment of the present invention.

FIG. 1 is a diagram that shows the schematic construction of an information recording apparatus according to a first embodiment of the present invention.

Referring to FIG. 1, there is formed an insulating thin film 1b on a conductive substrate 1a, and metal nanoparticles 2 are arrayed on a top surface thereof, wherein the metal nanoparticles 2 are fine particles each including therein a fine particle of ferromagnetic material. In the present embodiment, and also in the present invention, the word "ferromagnetic" further includes a ferrimagnetic material in addition to the ferromagnetic material of narrow definition. In FIG. 1, such fine particles are arrayed with a distance generally equal to the diameter of the metal nanoparticles 2 or with a distance not exceeding several times the diameter of the nanoparticles. The gap between the metal nanoparticles 2 may be left void or may be filled with a medium of small dielectric constant. Thus, the metal nano-particles 2 are electrically insulated from each other.

Further, adjacent to the end part of the array of the metal nanoparticles 2, there are disposed oscillation-mode conversion elements 3 and analyzers 4 each formed of metal nanoparticles of generally bar shape or spheroid shape.

With the construction of FIG. 1, localized plasmon is induced in a specific metal nanoparticle forming an oscillation-mode conversion element 3 with a near-field light, by using near-field light probe 13, wherein the near-field light probes 13 and 14 may be an optical fiber having a sharpened tip end formed by etching, or the like, and coated with a metal film. Thereby, the localized plasmon is induced in the foregoing specific metal nanoparticle by the near-field light probe 13 when a light from a light emitting device is injected into the foregoing optical fibers constituting the near-field light probe 13.

With this, there is induced a localized plasmon in the selected metal nanoparticle of the oscillation-mode conversion element 3, in such a manner that the direction of the electric field is aligned in the major axis direction thereof. The localized plasmon thus excited travels through the array of the metal fine particles 2 one by one via the intervening near-field light in the form of the wave of plasmon polariton, and causes excitation of the metal nano-particle constituting the analyzer 4 when reached the other end of the array.

Here, it should be noted that the metal nanoparticles 2 including the ferromagnetic material have approximately the size of 4-50 nm, while the magnetic material of this size is characterized by a single domain structure of aligned spin direction.

It should be noted that the metal nanoparticles 2 including the ferromagnetic material are formed of a material of face centered cubic system or face centered tetragonal system with a spin generally perpendicular to the conductive substrate 1a. When an electric field parallel to the conductive substrate 1a but oriented in the traveling direction of the plasmon polariton wave is applied to such a structure, there is induced a lateral electric field component parallel to the conductive substrate 1a but perpendicular to the traveling direction of the plasmon polariton wave.

Figure 2:
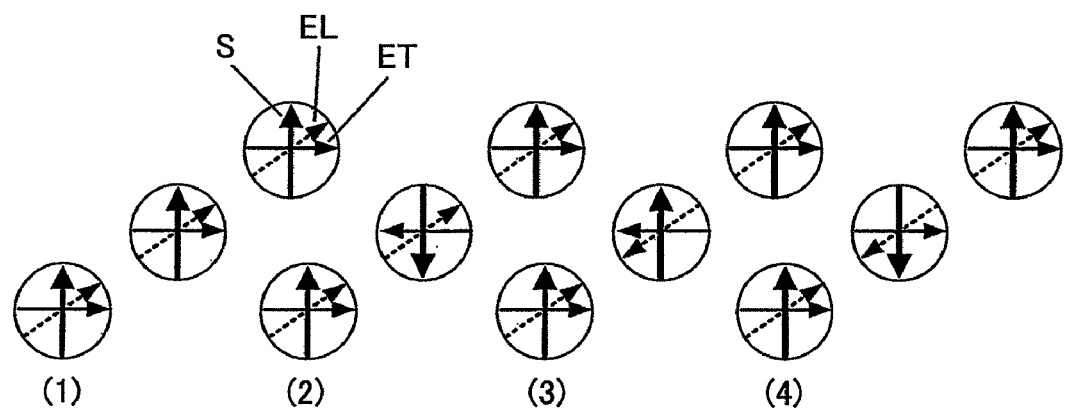
FIG. 2 is a diagram showing the direction of electric field of metal nanoparticles according to the first embodiment of the present invention.

This situation will be explained with reference to FIG. 2, wherein FIG. 2 shows four cases (1)-(4) of linearly aligned metal nanoparticles 2. Because of the small size of the metal nanoparticles 2, there is induced, with such a system, a mode characterized by uniform electric field down to the interior of the particle.

Now, suppose the case in which an electric field EL of longitudinal direction (traveling direction of the plasmon polariton) is induced in the metal nanoparticle 2 including the ferromagnetic material in the case (1) of FIG. 2 when the spin S is in the up spin state.

Because the nanoparticle 2 including ferromagnetic material is likely to have the dielectric constant tensor similar to the dielectric tensor induced in a bulk uniaxial crystal by magneto-optical effect, such longitudinal electric field EL induces, as a result of the magneto-optical effect, a transversal electric field ET in the direction perpendicular to the direction of spin S and further to the direction of the electric field EL as shown by an arrow in FIG. 2, case (1). Here, the "direction of spin S" means the direction of the spin angular momentum, which is coincident to the direction of the magnetic moment of the metal nanoparticle 2 including the ferromagnetic material.

It should be noted that the direction of this transversal electric field ET changes depending on the direction of the spin S of the metal nanoparticle 2 that contains the ferromagnetic material.

Such an example is shown in FIG. 2, case (2).

Referring to the drawing, three metal nanoparticles 2 are aligned in a row, wherein it can be seen that the spin S is directed to the downward direction in the second metal nanoparticle 2 including the ferromagnetic material.

Thus, within this particle, there is induced a transversal electric field ET with the direction opposite to the transversal electric fields ET of the adjacent front and rear metal nanoparticles 2, and the transversal electric field ET propagating in the longitudinal direction in FIG. 2, case (2), is canceled out as it passes through the metal nanoparticle 2 of the downward spin S, resulting in a reduced electric field strength.

Thus, in the case (2) of FIG. 2, the analyzer 4 is excited by the electric field component obtained as the sum of the transversal electric fields ET of different phases, wherein the electric field component that excites the analyzer reflects the different directions of the spin S of the metal nanoparticles 2. More specifically, the transversal electric field ET traveling along the metal nanoparticles 2 of different spin directions experiences cancellation and attenuation, while the transversal electric field ET traveling along the metal nanoparticles 2 of the same spin direction experiences augmentation.

Thereby, by disposing the analyzer 4 such that the major axis thereof becomes parallel to the conductive substrate 1a and at the same time perpendicular to the traveling direction of the plasmon polariton wave, it becomes possible to excite the metal nanoparticle of the analyzer 4 by selecting the transversal electric field ET induced by the spin S of the metal nanoparticle 2 including the ferromagnetic material therein and perpendicular to the traveling direction of the plasmon polariton wave.

The cases (3) and (4) of FIG. 2 show the examples of the oscillation mode in which the longitudinal electric field EL has different components depending on the metal nanoparticles 2.

Even in such a case, it is possible to add the components of different phases similarly to the cases (1) and (2) of FIG. 2 in view of the fact that the direction of the transversal electric field ET is different with regard to the longitudinal electric field EL depending on the spin direction of the metal nanoparticle 2 including the ferromagnetic material, as long as the phase of the transversal mode is not very much different from the phase of the longitudinal mode.

With the construction of FIG. 1, another near-field light probe 14 is used to measure the near-field optical intensity for plural analyzers 4. Further, another oscillation mode conversion element 3 is excited by using the near-field light probe 13 and the near-field light intensity is measured for the plural analyzers 4 while using the near-field light probe 14. Further, by repeating this procedure, it becomes possible to identify the spin direction for each of the metal nanoparticles 2 based on the quantity of light detected through the near-field light probe 14.

Thus, by assigning the recording information of "1" and "0" to the up-spin state and down-spin state of each metal nano-particle 2, respectively, it becomes possible to read out the recorded information by way of the foregoing procedure.

With the construction of the present embodiment, recording of information is conducted by disposing a cantilever 12 carrying thereon a stylus (minute stylus) of a size near the size of each metal nanoparticle 2 such that the cantilever 12 comes close to each metal nanoparticle 2 and causing to flow a tunneling current from the cantilever 12 to the conductive substrate 1a via the metal nanoparticle 2 by applying an electric field between the cantilever 12 and the conductive substrate 1a.

It should be noted that the tip end of the minute stylus under the cantilever 12 is formed to the size of several ten nanometers or less by way of etching process. Further, the stylus is formed of a conductive material that contains a ferroelectric material. Thereby, the ferromagnetic material has to have the spin direction aligned perpendicularly to the conductive substrate 1a. With this, it becomes possible to align the direction of spin for the metal nanoparticles 2 by the electric current flowing through the minute stylus in the direction perpendicular to the conductive substrate 1a, and it becomes possible to align the spin direction of the metal nanoparticle 2 in any of the upward direction and downward direction by the spin transfer torque, which is formed in response to the direction of the electric current. In other words, it becomes possible to perform recording of information.

While the foregoing construction has used a conductive material including ferroelectric material for the minute stylus underneath the cantilever 12, it is also possible to use a conductive substrate including a ferromagnetic material for the substrate 1a. In this case, it is necessary to align the spin of the conductive substrate 1a including the ferroelectric material in the direction perpendicular to the substrate. In this case, it is possible to use a non-magnetic conductive material for the minute stylus provided underneath the cantilever 12.

Further, it is also possible to use such a conductive substrate 1a including ferroelectric material in combination with the minute stylus of the ferromagnetic material. In this case, it becomes possible to change the spin direction of the metal nanoparticle 2 by electric current with further improved efficiency by when the spin of the ferromagnetic material is aligned in the direction perpendicular to the conductive substrate 1a for both of the stylus and the substrate.

Further, while the construction of FIG. 1 uses the oscillation mode conversion element 3 formed of the metal nanoparticles of the spheroid form, it is also possible to use the metal nanoparticles 2 in place of the oscillation mode conversion element 3 as long as it is possible to excite the electric field component of the direction parallel to the traveling direction (longitudinal direction) of the wave by the near-field light probe 13. In this case, the oscillation mode conversion element 3 can be omitted.

Similarly, it is also possible to detect the change of the amount of light propagating through the metal nanoparticles 2 without the analyzer 4 by using the near-field light probe 14, although the detection becomes more difficult because of superposition of transversal component and longitudinal component.

Next, the fabrication process of the device structure of FIG. 1 will be explained for the purpose of further clarification of the function and effect of the present invention. It should be noted, however, that the present invention is by no means limited to the method described below.

First, a conductive ferromagnetic film (conductive substrate 1a) is formed on a substrate by using a thin-film forming process such as sputtering process, vacuum evaporation deposition process or plating process, wherein it is preferable to use a material of high spin polarity of conduction electrons for the ferromagnetic material for inducing magnetic switching by the spin transfer torque. For example, it is possible to use a 3d transitional metal alloy such as Co—Fe alloy, a conductive ferromagnetic oxide such as $CrO_2$, $Fe_3O_4$, or the like, or a Heusler alloy such as $Co_2MnAl$, $Co_2MnGe$, $Co_2CrGa$, or the like, for the ferromagnetic material of high spin polarity. Further, it is possible to use a ferromagnetic semiconductor material such as (Ga,Mn)As, GeFe, or the like.

Next, on the ferromagnetic conductive thin film (conductive substrate 1a) thus formed, formation of the insulating thin film 1b such as Al—O, Al—N, $SiO_2$, $Si_3N_4$, MgO, ZnSe, (Ga,Al)As, AlHf, or the like, is conducted by using a similar thin film formation process. In addition to the foregoing process of depositing an oxide or nitride directly, the formation of the insulating thin film 1b may be conducted also by applying an oxidation processing or nitridation processing after forming a metal thin film of Al, Si, Mg, Hg, Zr, Ta, or the like. It should be noted that this insulating thin film 1b has to be formed with an extremely small thickness for allowing tunneling of the conductive electrons, and it is preferable to form the insulating thin film 1b with the thickness of the range of 0.2 nm-5 nm.

Next, a layer of the metal nanoparticles 2 is formed on the insulating layer (insulating thin film 1b) such that the metal nanoparticles 2 form a two-dimensional array therein. This process is conducted as follows.

First, a thin film of a ferromagnetic material of large magnetic anisotropic energy, such as FePt, CoPt, a rare earth alloy, or the like, is deposited on the insulating layer with the thickness of 0.5 nm-50 nm. By using the ferromagnetic material of large magnetic anisotropic energy, it becomes possible to maintain the magnetic moment in the direction of easy axis of magnetization also in the case of the nanoparticles even when thermal disturbance is caused in the magnetic moment, and it becomes possible to secure the non-volatile nature of the recorded information.

In this procedure, it is also important to align the easy axis of magnetization of the deposited ferromagnetic material in the direction perpendicular to the substrate surface. Thus, in the case of forming a thin film of FePt, the crystal growth process is controlled during the process of formation of the thin film such that the c-axis of the L10 crystal is aligned perpendicularly to the substrate surface.

Next, on the ferromagnetic film thus deposited, a diblock copolymer such as polystyrene (PS)—polymethyl methacrylate (PMMA) is coated uniformly by a spin coating process, or the like, and thermal processing is conducted under an appropriate temperature environment.

With this process, there is caused a phase separation phenomenon between PS and PMMA in the diblock copolymer film, resulting in self-organized formation of sea-island structure.

In such a sea-island structure, the size of the islands or the two-dimensional repetition period of the islands can be controlled by way of controlling the concentration ratio between PS and PMMA, the thickness of the diblock copolymer film, the shape of the polymer coating, thermal processing temperature, and the like. As a result, it becomes possible to obtain a sea-island structure by the islands of the diameter of 0.5 nm-50 nm forming a desired two-dimensional ordered structure such as a square lattice structure, a hexagonal lattice structure, or the like.

Next, patterning of the ferromagnetic metal film is conducted while using the diblock copolymer film having the sea-island structure formed as a result of the phase separation.

More specifically, ion milling is conducted from the top of the diblock copolymer film down to the level immediately above the insulating thin film by using Ar ions or the like. Thereby, because of the difference of ion milling resistance between the island part and the sea part of the diblock copolymer, the ferromagnetic metal film is removed by etching except for the part locating located right underneath the island structure.

Thereafter, the remaining polymer film is removed, and there is obtained a two-dimensional ordered structure of the metal ferromagnetic nanoparticles 2 having a cylindrical form with the diameter of 0.5 nm-50 nm. Reference should be made to Non-Patent References 3 and 4.

In addition to the foregoing, it is also possible to form such two-dimensional ordered array of the nanoparticles by the process of arraying the ferromagnetic nanoparticles of FePt, or the like, formed by wet chemical synthesis, on the substrate carrying the foregoing insulating thin film by a self-organizing process. Reference should be made to Non-Patent Reference 5.

Further, an insulating thin film of small dielectric constant is deposited on the two-dimensional array of the ferromagnetic metal nanoparticles by using a sputtering process or vacuum evaporation deposition process so as to fill the gap between the nanoparticles. Further, by planarizing the surface of the insulating film thus formed by a electrochemical buffing (CMP) process, or the like, the desired device structure is finally obtained.

Second Embodiment

Figure 3:
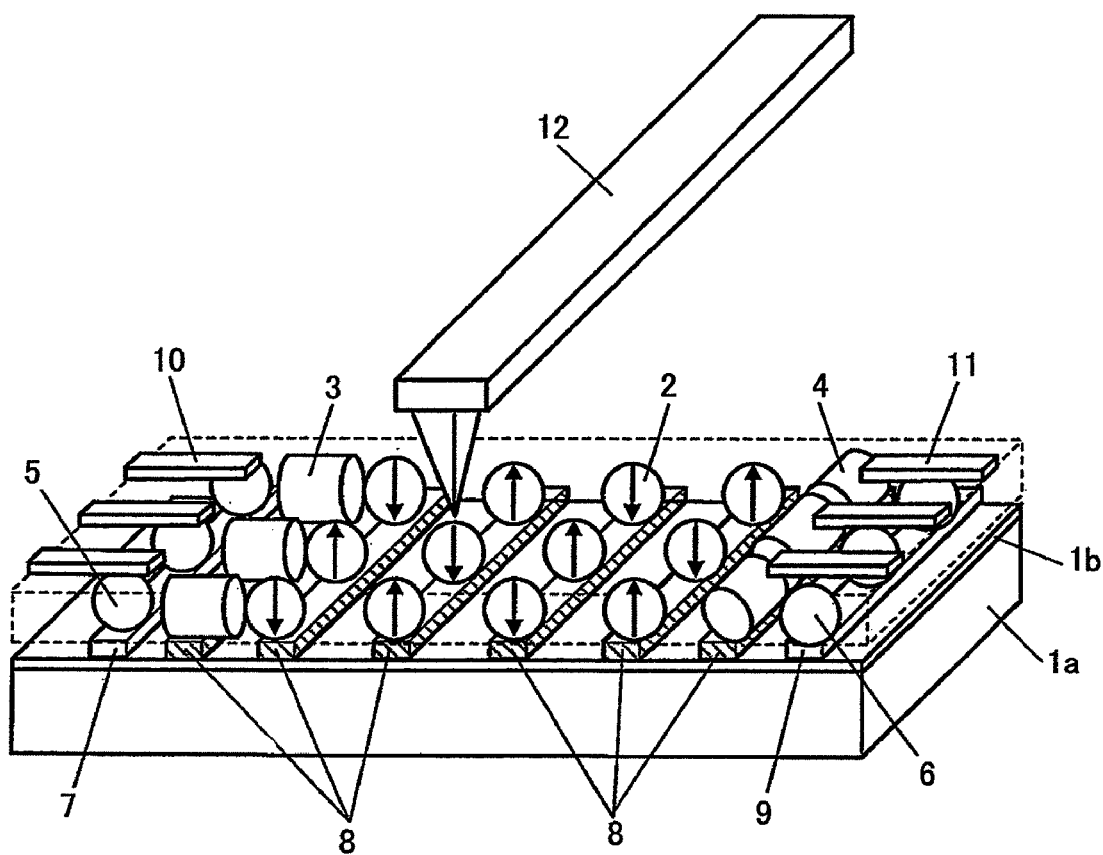
FIG. 3 is a diagram schematically showing the construction of an information recording apparatus according to a second embodiment of the present invention.

FIG. 3 is a diagram showing the schematic construction of an information recording apparatus according to a second embodiment of the present invention, wherein those parts corresponding to the parts described previously are designated by the same reference numerals and the description thereof will be omitted.

Referring to FIG. 3, the present embodiment has a construction generally identical to that of the first embodiment, except that there are disposed light-emitting devices 5 formed of semiconductor nanoparticles and photo-electric conversion elements 6 formed of semiconductor nanoparticles at respective ends of the metal nanoparticle array. Similarly to the previous embodiment, the gap between the metal nanoparticles 2 is filled with a material of low dielectric constant.

Further, with the construction of FIG. 3, there is provided an electrodes 7 on the insulating thin film 1b over the conductive substrate 1a in contact with the light-emitting devices 5, and there is provided an electrode 9 in contact with the photo-electric conversion elements 6. Further, there are formed electrodes 10 and 11 respectively in contact with the top part of the light-emitting devices 5 and the top part of the photo-electric conversion elements 6.

Thus, with the construction of FIG. 3, it is possible to cause optical emission in each of the light-emitting elements 5 individually by causing to flow an electric current to a selected electrode 7 and a selected electrode 10. Further, it is possible to measure the amount of light incident to each of the photo-electric conversion elements 6 individually by detecting the electric current between the selected electrode 9 and the selected electrode 11.

Thus, by detecting the electric current between the selected electrodes 9 and 11, it is possible with the construction of FIG. 3 of the present embodiment to detect the change of the amount of transmitted light and retrieve the recorded information, in place of detecting the amount of light by using the near-field optical probes 13 and 14 as in the case of the embodiment of FIG. 1.

It should be noted that each of the light-emitting devices 5 is formed of a semiconductor nanoparticle having a pn junction therein. Such a nanoparticle may be formed of a nanoparticle of Si, Ge, a compound semiconductor material, or a nanostructure of equivalent size.

With regard to the light-emission device 5 of nanometer size, it should be noted that there is already reported a current-driven LED having a pn junction and a nanometer size quantum dot structure. Reference should be made to Non-Patent Reference 6.

With the construction of FIG. 3, it is noted that there are provided insulation patterns 8 of stripe shape for supporting the metal nanoparticles 2, while these insulation patterns 8 may be omitted if it is desired. Otherwise, the present embodiment of FIG. 3 has the construction similar to that of the construction of the first embodiment, including the operation of information recording.

Next, the fabrication process of the structure of FIG. 3 will be explained.

With the present embodiment, the light-emitting devices 5 or the photo-electric conversion elements 6 are formed by using photolithography or electron beam lithography in which optical exposure process or electron beam drawing process is combined with an ion milling process or reactive ion etching process.

More specifically, a p-type semiconductor thin-film and an n-type semiconductor thin-film are deposited consecutively on a pertinent part of the substrate on which the light-emitting elements 5 and the photo-electric conversion elements 6 are to be formed, and with this, there is formed a pn junction thin-film. Further, the pn junction thin-film thus formed are patterned in the form of nano-particles by way of photolithography or electron beam lithography. Reference should be made to Non-Patent Reference 4. Otherwise, the structure of FIG. 3 is formed similarly to the case of the first embodiment.

Third Embodiment

Figure 4:
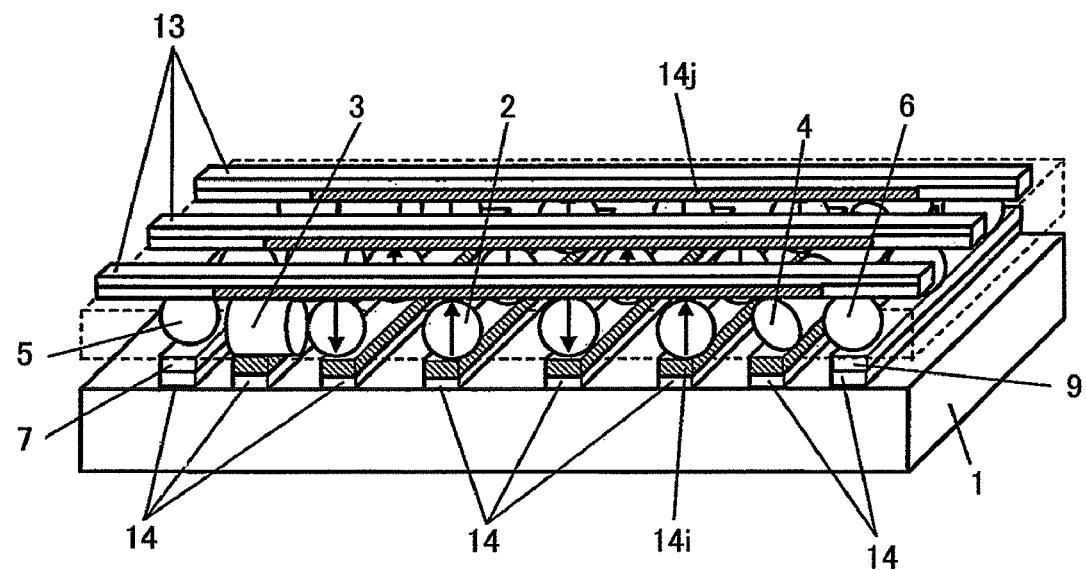
FIG. 4 is a diagram schematically showing the construction of an information recording apparatus according to a third embodiment of the present invention.

FIG. 4 is a diagram showing the schematic construction of an information recording apparatus according to a third embodiment of the present invention, wherein those parts corresponding to the parts described previously are designated by the same reference numerals and the description thereof will be omitted.

Referring to FIG. 4, the information recording apparatus of the present embodiment has a construction somewhat similar to that of the second embodiment, except that the present embodiment uses an insulating substrate 1 of an insulating material in place of the conductive substrate 1a. Further, with the present embodiment, it can be seen that the stripe shape electrode 7 is formed on the substrate 1 in contact with the light-emitting elements 5. Further, the stripe shape electrode 9 is formed in contact with the photo-electric conversion elements 6.

In the present embodiment, too, the gap between the metal nanoparticles 2 is filled with a material of low dielectric constant, similarly to the first and second embodiments.

Further, as shown in FIG. 4, there are provided common electrodes 13 each in contact with a top part of a light-emitting element 5 and a top part of a photo-conversion element 6. Thereby, it should be noted that there is provided an insulating layer 14j underneath each electrode 13 such that the electrodes 13 are insulated from the metal nanoparticles 2, the oscillation mode conversion elements 3 and the analyzers 4.

Similarly, there is formed a stripe electrode 14 underneath each of the metal nanoparticles 2, the oscillation mode conversion elements 3 and the analyzers 4, with an intervening insulating layer 14i interposed therebetween.

With the foregoing construction, it is possible to activate each of the light-emitting elements 5 individually by causing to flow electric current between a selected electrode 7 and a selected electrode 13.

Further, with such a construction, it is possible to measure the detected amount of light of a selected ach photo-electric conversion element 6 by detecting a current between a selected electrode 9 and a selected electrode 13. With this, it becomes possible to obtain the recorded information by detecting the amount of the propagated light similarly to the case of the second embodiment.

Next, recording of information for the third embodiment will be described.

As noted above, the information recording apparatus of the third embodiment includes the stripe electrodes 13 and 14 above and below the metal nanoparticles 2 via insulating layers 14j and 14i.

Thus, with the construction of FIG. 4, it is possible to cause a tunneling current to flow through the metal nanoparticle 2 in the direction perpendicular to the insulating substrate 1 by applying an electric potential between the electrodes 13 and 14.

Thereby, the spin orientation of a specific metal nanoparticle 2 is controlled by utilizing the difference of spin transfer torque caused by the direction of the electric current, and with this, recording of information becomes possible to a specific metal nanoparticle 2.

Otherwise, the present embodiment is identical to those of the first and second embodiments and further description thereof will be omitted.

The information recording apparatus of the present embodiment can be fabricated as follows.

With the present embodiment, conductive ferromagnetic patterns of stripe shape (electrodes 13 and 14) are formed by a photolithographic process or electron beam lithographic process in which optical exposure process or electron beam drawing process is combined with an ion milling process or reactive ion etching process. Similarly to the case of the first embodiment, it is preferable to use a material of high spin polarity for the conductive ferroelectric material.

Otherwise, the fabrication process of the present invention is identical to that of the first embodiment.

Fourth Embodiment

Figure 5:
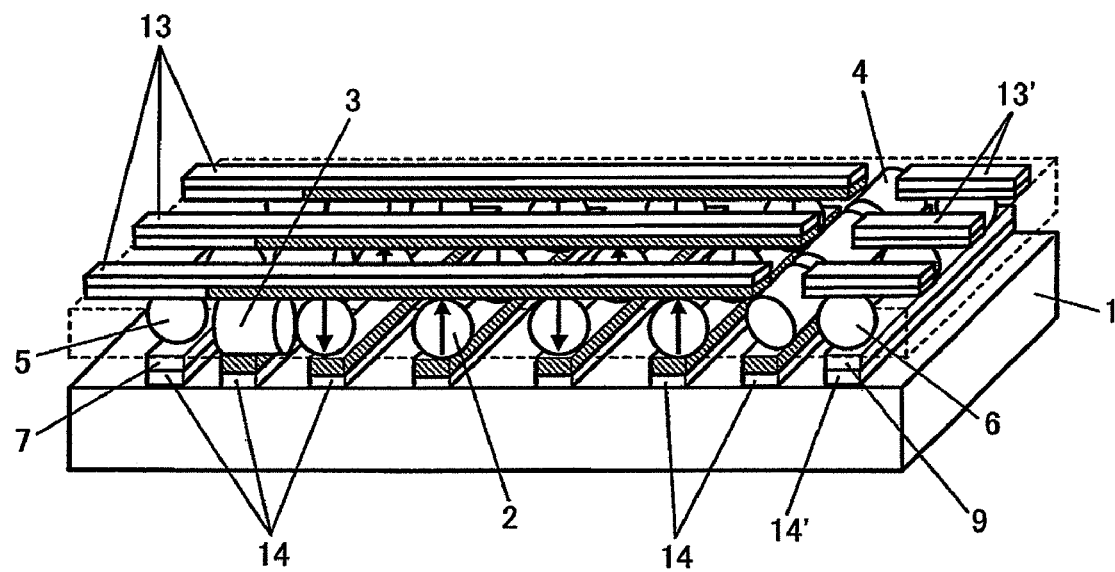
FIG. 5 is a diagram schematically showing the construction of an information recording apparatus according to a fourth embodiment of the present invention.

FIG. 5 is a diagram showing the schematic construction of an information recording apparatus according to a fourth embodiment of the present invention, wherein those parts corresponding to the parts described previously are designated by the same reference numerals and the description thereof will be omitted.

Referring to FIG. 5, the information recording apparatus of the present invention has a construction generally identical to that of the third embodiment, except that each electrode 13 is divided in the part corresponding to the top part of the analyzer 4, and there are provided electrodes 13' in correspondence to the photo-electric conversion elements 6. Thus, the information recording and reproducing apparatus of the present embodiment includes the electrodes 13' in addition to he electrodes 13. Further, while FIG. 5 shows an example in which each electrode 13 is divided into two parts, it is sufficient that the separated parts of the electrode are electrically insulated from each other, and the gap between the separated parts may be filled with an insulating material.

Similarly, an electrode 14' formed on the insulating substrate 1 is electrically insulated from the electrode 14 and is divided from the electrode 14 at a part near the underside of the analyzer 4. Otherwise, the present embodiment has the construction and function similar to those of the third embodiment.

Fifth Embodiment

Next a fifth embodiment of the present embodiment will be described, wherein those parts corresponding to the parts described previously are designated by the same reference numerals and the description thereof will be omitted.

With the first through fourth embodiments described heretofore, a set of an oscillation mode conversion element 3 and an analyzer 4 or a set of a light emitting element 5, an oscillation mode conversion element 3, a photo-electric conversion element 6 and an analyzer 4 is provided for each array of the metal nanoparticles 2, while this construction assumes the propagation of the wave of plasmon polariton through each array of the metal nanoparticles 2 in the direction from the oscillation mode conversion element 3 to the analyzer 4.

However, it is also possible to provide such a set of an oscillation mode conversion element 3 and an analyzer 4 or a set of a light emitting element 5, an oscillation mode conversion element 3, a photo-electric conversion element 6 and an analyzer 4 for the array of the metal nanoparticles 2 perpendicular to the foregoing array of the metal nanoparticles 2.

With this, it becomes possible to cause the wave of plasmon polariton to propagate in the direction perpendicular to the direction explained with reference to the first through fourth embodiments, and more detailed detection of recorded information becomes possible as compared with the case of the first through fourth embodiments by using a larger number of photo-electric conversion elements. Otherwise, the construction and function including recording of information are identical to those of the first through fourth embodiments.

Further, with the information recording apparatus of the present embodiment, the wave of plasmon polariton propagates by way of scattering or diffusion of plasmon or near-field light while causing interaction between adjacent metal nanoparticles 2, and thus, it becomes possible to read the spin information of adjacent metal nanoparticles 2 simultaneously.

Further, by recording the information and further recording summary information summarizing the recorded information in different regions of the information recording apparatus, it becomes possible to carry out the reading of desired information by first reading out the summary information and carrying out the detailed reading only in the case it is judged that the desired information is included in the summary information. With this, it becomes possible to increase the speed of information selection or search, and the problem of search and accessibility of information that arise with increase of the recording density of the information recording apparatus, is successfully eliminated. Thereby, high-speed reading of information becomes possible.

Sixth Embodiment

Figure 6:
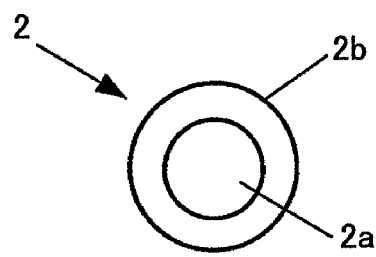
FIG. 6 is a diagram schematically showing the construction of an information recording apparatus according to a fifth embodiment of the present invention.

FIG. 6 shows the metal nanoparticle used with the information recording apparatus according to a sixth embodiment of the present invention, wherein those parts corresponding to the parts described previously are designated by the same reference numerals and the description thereof will be omitted.

With the sixth embodiment, an information recording apparatus having the construction similar to those explained with reference to the first through fifth embodiments is used, except that the information recording apparatus of the present embodiment uses a metal nanoparticle having the structure shown in FIG. 6 for the metal nanoparticles 2.

Referring to FIG. 6, the metal nanoparticle 3 includes a nanoparticle 2a of a ferromagnetic material such as Fe—Pt alloy, and a thin layer 2b of gold (Au) or silver (Ag) is provided so as to cover the ferromagnetic nanoparticle 2a.

By using such a metal nanoparticle 2, it becomes possible to change the resonant characteristics of plasmon by changing the thickness of the surrounding metal layer 2b, and it becomes possible to increase the degree of freedom of design of the information recording apparatus.

Otherwise, the present embodiment is identical to the preceding embodiments and the description thereof will be omitted.

Seventh Embodiment

Figure 7:
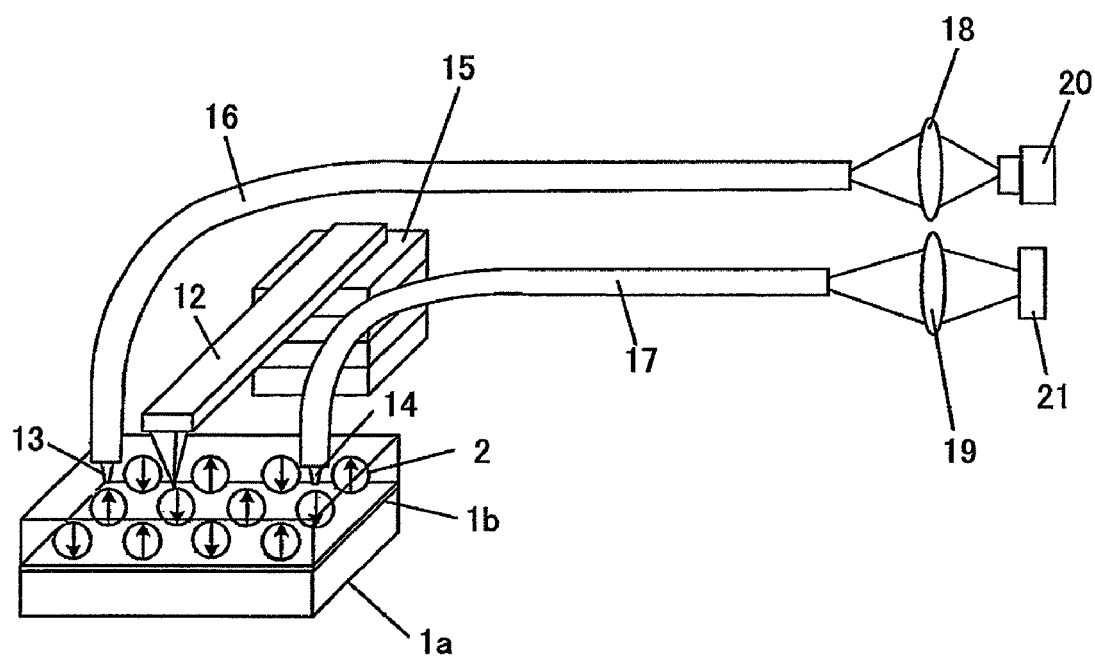
FIG. 7 is a diagram schematically showing the construction of an information recording apparatus according to a seventh embodiment of the present invention.

FIG. 7 is a diagram showing the construction of an information recording apparatus according to a seventh embodiment of the present invention, wherein those parts corresponding to the parts described previously are designated by the same reference numerals and the description thereof will be omitted.

Referring to FIG. 7, the information recording apparatus of the present embodiment has the construction similar to that of the first embodiment except that the oscillation mode conversion element 3 and the analyzer 4 are omitted.

Thus, as shown in FIG. 7, the information recording apparatus includes the insulating thin film 1b formed on the conductive substrate 1a, and the metal nanoparticles 2 including therein a ferromagnetic material are arrayed on the insulating thin film 1b.

Thereby, the metal nanoparticles 2 are disposed with such a direction that the magnetic moment thereof becomes perpendicular to the plane of the conductive substrate 1a, and a cantilever including minute stylus of conductive material containing the ferromagnetic material is disposed over the array of the metal nanoparticles 2. The cantilever 12 can be moved over the array of the metal nanoparticles 2 in three-dimensional directions by way of a driving part 12 formed of a piezoelectric element.

Next, a metal coating is provided to the end parts of polarization-preserving fibers 16 and 17 to form the near-field optical probes 13 and 14 of tapered form having a minute opening at the tip end part, wherein the near-field optical probes 13 and 14 are used for the optical excitation means and the optical detection means.

The near-field optical probes 13 and 14 thus formed respectively at the end parts of the optical fibers 16 and 17 are disposed close to the top part of the metal nanoparticles 2 from the upward direction thereof, while a collective lens 18 and a light-emitting device such as a laser diode are disposed at the other end of the polarization-preserving optical fiber 16. Further, a collective lens 19 and a photo-electric conversion element 21 such as a photodiode are provided at the other end of the polarization-preserving optical fiber 17. Thereby, the light emitted from the light-emitting element is focused to the end surface of the polarization-preserving fiber 16 by the collective lens 18, and with this, it becomes possible to excite a near-field light at the tip end part of the near-field optical probe 13 with the direction of the electric field parallel to the plane of the substrate.

Further, with the construction of FIG. 7, in which the polarization-preserving fiber 16 is disposed perpendicularly to the conductive substrate 1a, it becomes possible to rotate the direction of the electric field of the excited near-field light in the plane parallel to the plane of the substrate 1a by rotating the polarization-preserving fiber 16 about an axis thereof Thus, with this method, it becomes possible to excite an oscillation mode for the plasmon and near-field light in a specific metal nanoparticle 2 or simultaneously in plural metal nanoparticles 2, with an arbitrary direction of electric field within the plane parallel to the plane of the substrate 1a.

Further, there is excited a near-field light at the tip end part of the near-field light probe 14 with a specific direction of the electric field determined in accordance with the directions of the electric field of the near-field lights formed around the metal nanoparticles 2 in the plane parallel to the substrate, wherein the near-field light thus excited are propagated through the polarization-preserving fiber 17 in coupling with the light propagated therethrough.

In this case, the polarization-preserving fiber 17, functioning as the analyzer, allows transmission of waveguide mode of a specific polarization direction, and thus, it becomes possible to detect the light originating from the near-field light formed around the metal nanoparticle 2 with specific electric field with strong intensity. Thus, by using the collective lens 19 and the photo-electric conversion element 21, it becomes possible to detect the change of the amount the propagated light in the form of change of electric current.

Further, while not illustrated, it is possible to provide a cantilever similar to the cantilever 12 explained before so as to carry the near-field light probes 13 and 14 and move the cantilever 12 over the metal nanoparticles 2. Thereby, it becomes possible to excite an arbitrary metal nanoparticle 2 by using the near-field light probes 13 and 14 and it becomes also possible to detect the direction of the electric field of the near-field light and detect the intensity thereof.

Otherwise, the present embodiment is identical to other embodiments with regard to the construction and fabrication process, and further description thereof will be omitted.

Eighth Embodiment

Figure 8A:
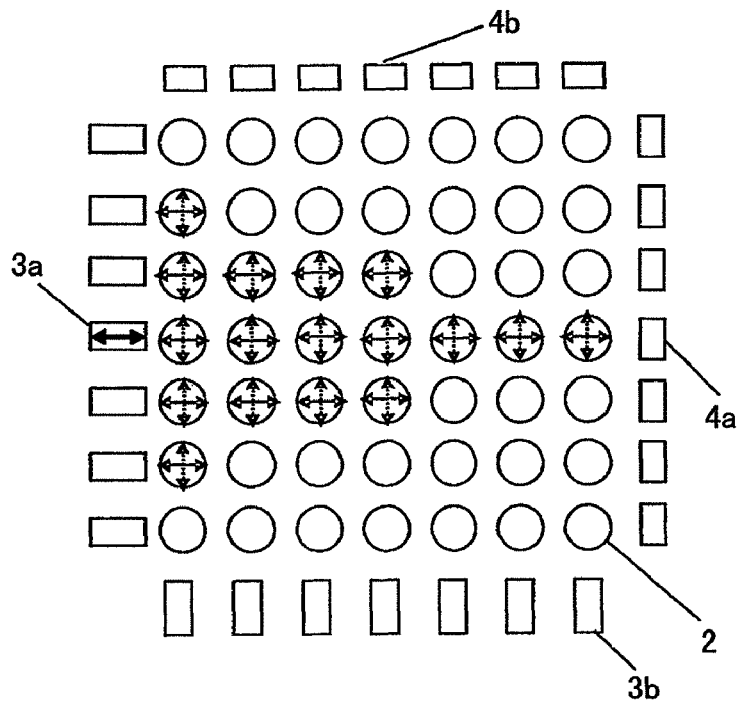
FIG. 8 is a diagram explaining the operation of the metal nanoparticles arrayed on a plane of a substrate according to the eighth embodiment of the present invention.
Figure 8B:
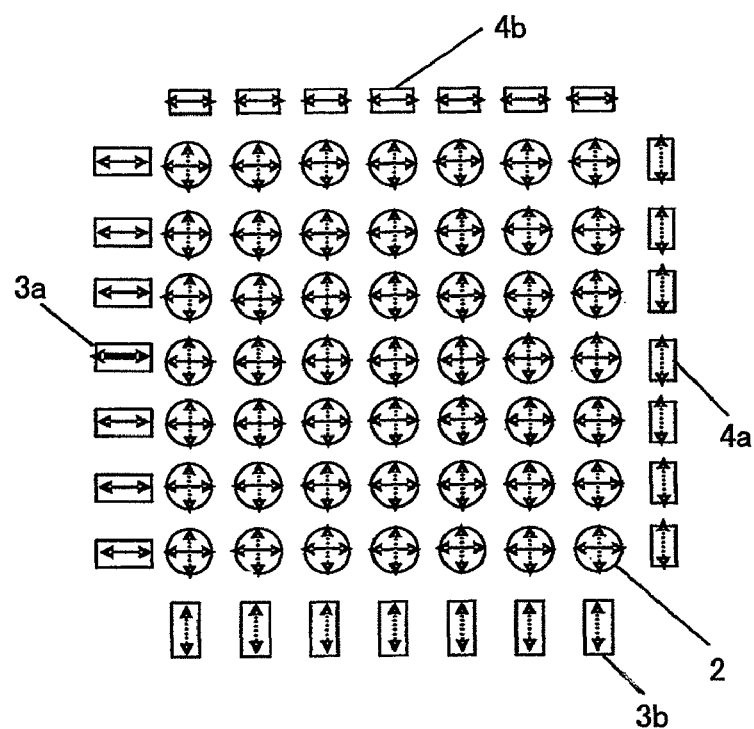

FIGS. 8A and 8B are diagrams explaining the operation of an information recording apparatus according to an eighth embodiment of the present invention in which the metal nanoparticles 2 are arrayed two-dimensionally on a plane of the substrate. In FIGS. 8A and 8B, those parts corresponding to the parts described previously are designated by the same reference numerals and the description thereof will be omitted.

In the example of FIGS. 8A and 8B, it should be noted that, in addition to the feature of the metal nanoparticles 2 are arrayed two-dimensionally on the plane of the substrate, there is an additional feature of the oscillation mode conversion elements 3 and the analyzers 4 (see FIG. 1) are also arrayed two dimensionally.

Thus, in FIG. 8A, the metal nanoparticles 2 are arranged in a 7×7 row and column formation, and oscillation mode conversion elements 3a and 3b are disposed along two intersecting edges of the array of the metal nanoparticles 2. Further, analyzers 4a and 4b are disposed along the other two intersecting edges of the array of the metal nanoparticles 2.

Here, it should be noted that the scale of the array of the metal nanoparticles 2 is by no means limited to the foregoing 7×7 array but any other scale can be used as long as it allows propagation of the oscillation mode.

With the present embodiment, one of the oscillation mode conversion elements 3a (shown with thick arrow of FIG. 8A) is subjected to the excitation of the oscillation mode of plasmon and the near field light by the near-field light probe 13 explained with reference to FIGS. 1 and 7, or by disposing the light-emitting devices 5 explained with reference to FIGS. 3-5 adjacent to the oscillation mode conversion elements 3, such that the oscillation mode has an oscillating electric field directed in the direction of the arrows.

In such a case, the oscillation mode propagates from the oscillation mode conversion element 3a to the metal nanoparticle 2 adjacent to the oscillation mode conversion element 3a at the right side thereof, while the oscillation mode thus propagated propagates further to the adjacent metal nanoparticles 2 at the right side thereof and also at the upper and lower side thereof in the illustration of FIG. 8A.

It should be noted that FIG. 8A also shows such scheme of propagation.

In FIG. 8A, the arrows represented by a broken line represent the oscillation mode caused by the magnetic moment of each metal nanoparticle 2 with the direction of the electric field perpendicular to the oscillation mode induced in the oscillation mode conversion element 3a. While the actual direction of oscillation may change depending on the direction of the magnetic moment of each metal nanoparticle 2, this oscillation mode also propagates through the metal nanoparticles 2 to the right and left and up and down in the sheet of the drawing, and causes excitation of plasmon and near-field light shown with the arrows of broken line in the analyzers 4a and 4b when the oscillation mode has reached the array of the analyzers 4a and 4b at the end part of the array of the metal nanoparticles 2.

Actually, all the metal nanoparticles 2 are excited as shown in FIG. 8B when an oscillation mode of plasmon and near-field light is induced in one of the oscillation mode conversion elements 3a with the oscillation direction of the electric field as represented by a thick arrow shown in FIG. 8B. Further, the oscillation modes of plasmon and near-field light represented by the arrows of broken line are excited in almost all of the metal nanoparticles 2, and the analyzers 4a in the array are excited with the oscillation mode having the direction of electric field identical to this oscillation mode. Furthermore, the oscillation mode conversion elements 3b are also excited by the oscillation mode of the same electric filed direction, while the analyzers 4b and the oscillation mode conversion elements 3a not excited with the foregoing oscillation mode are excited with an oscillation mode of the electric field represented in FIG. 8B with an arrow of continuous line.

It should be noted that the intensity of the oscillation mode excited in each of the analyzers 4a or the intensity of the oscillation mode excited in each of the oscillation mode conversion elements 3b can be detected by using the near-field optical probe 14 (see FIG. 1 or FIG. 7) or by disposing the photo-electric conversion elements 6 explained with reference to FIGS. 3-5 adjacent to the analyzers 4a or oscillation mode conversion elements 3b in the form of change of the electric current. Further, it is also possible to detect the intensity of the oscillation mode also for the analyzers 4b and the remaining oscillation mode conversion elements 3a.

Further, it should be noted that, when the oscillation mode of plasmon and near-field light is excited in another oscillation mode conversion element 3a with the foregoing oscillation direction of the electric field, the analyzers 4a forming the array are excited also with the oscillation mode of plasmon and near-field light with the oscillation direction of the electric field represented by the broken lines, similarly to the foregoing case.

Further, the oscillation mode conversion elements 3b are also excited with the oscillation mode of the same direction of the electric field, and thus, it is possible to obtain the intensity of the oscillation mode of the plasmon and near-field light according to the process similar to the one described before.

Thus, by repeating the foregoing procedure while changing the oscillation mode conversion element 3a, it is possible to obtain the intensity of the oscillation mode of the analyzers 4a or the oscillation mode conversion elements 3b for each of the oscillation mode conversion elements 3a, and it becomes possible to estimate the orientation of the magnetic moment for each of the metal nanoparticles 2 forming the 7×7 array.

Hereinafter, actual example of this method will be explained further in detail.

Suppose the case in which the I-th element of the oscillation mode conversion elements 3a counted from the top of the array and represented by the thick arrow in FIG. 8B has excited an oscillating mode of plasmon and near-field light in a specific metal nanoparticle 2 adjacent to the foregoing oscillation mode conversion element 3a with the electric field of intensity $E_I$ with the oscillation direction represented by an arrow of continuous line.

As noted previously with reference to FIG. 8A, the oscillation mode thus excited propagates from this metal nanoparticle 2 to the metal nanoparticles 2 located at the right and at top and bottom thereof in the sheet of the drawing of FIG. 8A.

Further, the oscillation mode represented by the arrow of broken line in FIG. 8A induced by the interaction of the foregoing oscillation mode and the magnetic moment causes propagation also through the metal nanoparticles 2 to the right and left and up and down in the sheet of the drawing of FIG. 8A and causes excitation of the oscillation mode of plasmon and near-field light represented by the arrow of broken line in the analyzers 4a and 4b when it has reached the array of the analyzers 4a and 4b formed at the end part of the row and column array of the metal nanoparticles 2.

Here, the intensity of the oscillation mode represented by the arrow of broken line and excited in the i-th metal nanoparticle 2 counted from the top of the array of the metal nanoparticles 2 and located adjacent to the analyzer 4a will be designated as Di. Further, the rate of propagation of the oscillation mode between adjacent nanoparticles 2 will be designated as L for the case the oscillation mode propagates in one direction parallel to the oscillation direction of the electric field and T for the case in which the oscillation mode propagates in one direction perpendicular to the oscillation direction of the electric field.

Further, a conversion efficiency matrix A is defined for the metal nanoparticles 2 for conversion of the oscillation mode from the oscillating mode represented by the arrow of continuous line to the oscillation mode perpendicular thereto as $$A = \{A_{ij}\} \quad (1)$$

and a normalized intensity $d_i$ of the oscillation mode represented by the arrow of broken line is represented as $$D_i = D_i/E_i \quad (2)$$

In this case, it should be noted that the normalized intensity di of the oscillation mode represented by the arrow of broken line generally becomes a function f of each element Aij of the matrix A and further the propagation ratios L and T and is represented as $$d_i = f(A_{11}, A_{12}, \ldots, A_{ji}, L, T). \quad (3)$$

Now, in the case the I-th oscillation mode conversion element 3a represented by the thick arrow has excited an oscillation mode of the intensity $E_I$ in a specific metal nanoparticle 2 adjacent thereto, there exist i normalized intensities $d_i$ for a specific value of I in view of the fact that the normalized intensity $d_i$ is defined for the i-th metal nanoparticle 2 adjacent to the analyzers 4a and counted from the top of the array of the metal nanoparticles 2.

Thus, the equation (3) is defined for each combination of i×i, and there exist $i^2$ equations in all for the equation (3).

Thus, $i^2$ equations can be obtained in the maximum for the equation (3) and it is possible to solve the simultaneous equations for each element Aji ($i \geq j$) of the matrix A, provided that the parameters L and T are known. Because it is possible to obtain a large number of equations including the matrix elements Aji by measurement, it is possible to select some of the equations for solving the parameters Aji when it is necessary in view of the requirement of measurement.

In the case of FIG. 8B, for example, the I-th normalized intensity $d_I$ is represented by the equation (4) below, the (I+1)-th normalized intensity $d_{I+1}$ is given by the equation (5) below, and the (I+2)th normalized intensity $I_{d+2}$ of the is given by the equation (6) below:

$$d_I = \sum_{j=1}^{j} A_{jl} L^{j-1} T^{j-1}, \quad (4)$$

$$d_{I+1} = \sum_{j=1}^{k} A_{jl} L^{j-1} T^{j-1} + A_{kl} LT \left( \sum_{j=k}^{j} A_{j(l+1)} L^{j-1} T^{j-1} \right), \quad \text{and} \quad (5)$$

$$d_{I+2} = \sum_{j=1}^{k} A_{jl} L^{j-1} T^{j-1} + \left( \sum_{u=1}^{i+l} A_{ku} L^{u-i+1} T^{u-i+1} \right) \left( \sum_{j=k}^{j} A_{j(l;2)} L^{j-1} T^{j-1} \right) + \quad (6)$$

$$A_{kl} LT \left\{ \sum_{j=k}^{l} A_{j(l+1)} L^{j-1} T^{j-1} + A_{l(l+1)} LT \left( \sum_{j=l}^{j} A_{j(l+2)} L^{j-1} T^{j-1} \right) \right\}.$$

Similarly, it is possible to obtain the (I−2)-th normalized intensity $d_{I-2}$ and (I−1)-th normalized intensity $d_{I-1}$, wherein it is assumed in the foregoing calculation that the oscillation mode has smaller intensity as compared with the oscillation mode in the downward direction and, because of the attenuation of the oscillation mode, excitation of the oscillation mode of the direction indicated by the arrow of broken line, or excitation of the oscillation mode of the direction indicated by the but taking place in a detour path is ignorable.

In each of the equations (1)-(6) above, it should be noted that the normalized intensity $d_I$ can be represented as a function of the matrix elements Aji, and it is possible to solve these equations simultaneously for each elements Aji. With this, it is possible to obtain a value and sign for these elements Aji. Thereby, it becomes possible to determine whether the recorded information is "0" or "1" for each of the metal nanoparticles 2. This determination is actually carried out by logic calculation means constructed in the form of electronic circuit.

In this case of the eighth embodiment, it is also possible to excite the oscillation mode of plasmon and near-field light shown by the arrow of broken line in one of the oscillation mode conversion elements 3b.

In this case, the oscillation mode of plasmon and near-field light shown with the arrow of broken line is inducted in each of the metal nanoparticles 2 contrary to the previously explained case, and there is caused the oscillation mode of plasmon and near-field light having the electric field in the same direction to the electric field direction represented by the arrow of continuous line by the magnetic moment of each metal nanoparticle 2. Further, it is also possible to detect the intensity of the oscillating mode for each element of the array of analyzers 4b and each element of the array of oscillation mode conversion elements 3a according to the detection process similar to the one explained before. This information can also be used for estimating the orientation of the magnetic moment of each metal nanoparticle 2.

Otherwise, the present embodiment is identical to those explained before including the fabrication process of the information recording apparatus and further description will be omitted.

Ninth Embodiment

Figure 9:
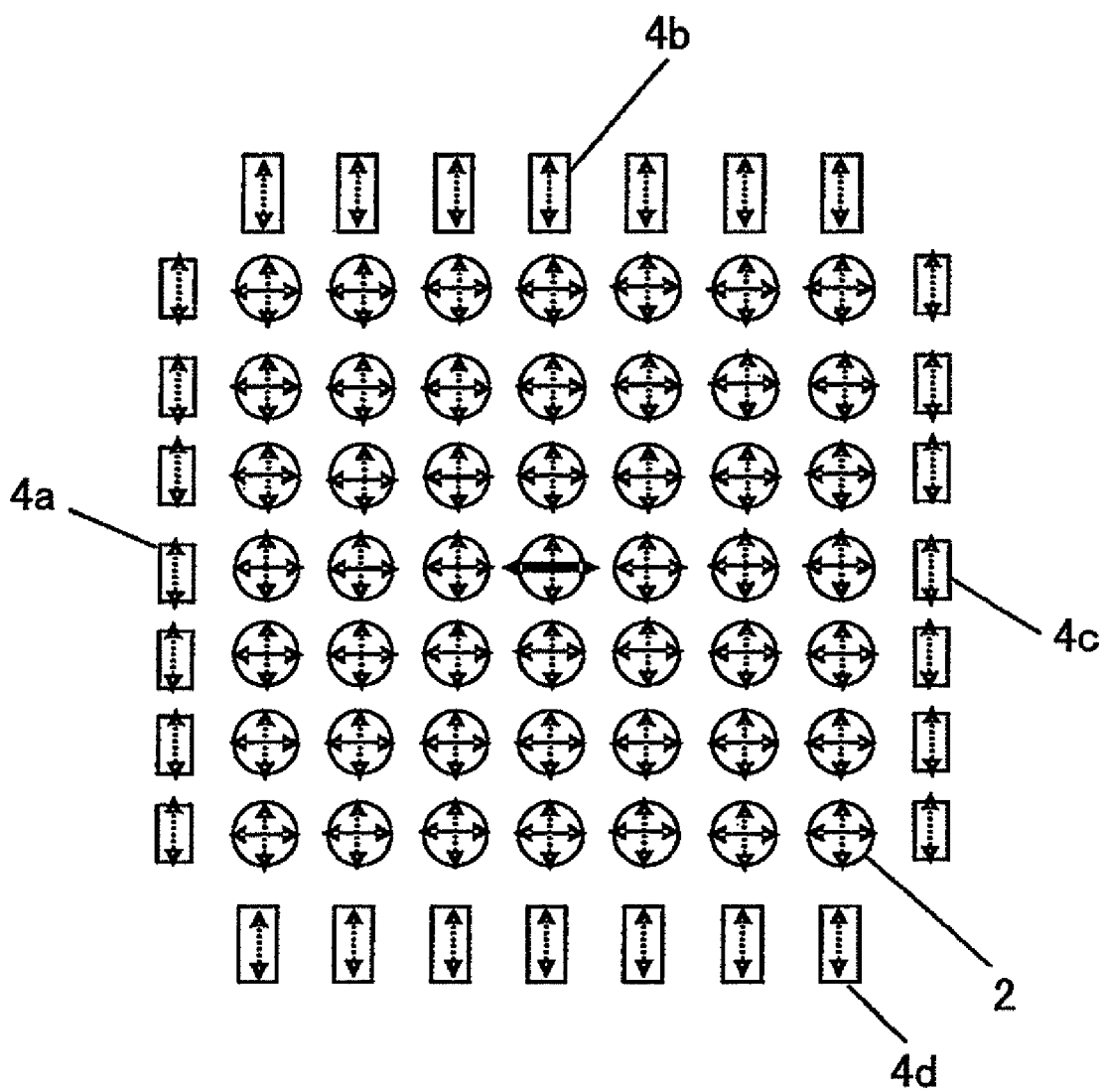
FIG. 9 is a diagram explaining the operation of the metal nanoparticles arrayed on a plane of a substrate according the ninth embodiment of the present invention.

FIG. 9 shows the operation of the metal nanoparticles arrayed two-dimensionally on a plane of the substrate according to a ninth embodiment of the present invention, wherein those parts corresponding to the parts described previously are designated by the same reference numerals and the description thereof will be omitted.

Referring to FIG. 9, the present embodiment has a construction somewhat similar to that of the previous embodiment explained with reference to FIG. 8B, except that there are disposed the arrays of analyzers 4a, 4b, 4c and 4d on the respective edges of the 7×7 array of the metal nanoparticles 2.

As shown in FIG. 9, these analyzers 4a, 4b, 4c and 4d have the shape and locations adapted such that there occurs excitation of the oscillation mode of the electric field direction identical to that of the oscillation mode represented by the arrow of broken line of the plasmon and near-field light excited in each of the metal nanoparticles 2.

Similarly to the case of the eighth embodiment, the oscillation mode of plasmon and near-field light having the electric field direction represented by the arrow of continuous line is excited in one of the metal nanoparticles 2 by the near-field probe 13. Alternatively, the oscillation mode may be excited simultaneously in plural metal nanoparticles 2.

The oscillation mode thus excited cause propagation through the metal nanoparticles 2 in the upward direction and downward direction and further in the right side direction and left side direction in the plane of the drawing of FIG. 9.

When the mode thus excited has reached the arrays of the analyzers 4a, 4b, 4c and 4d, there is excited the oscillation mode of plasmon and near-field light with the electric field direction represented by the arrow of broken line in the analyzers 4a, 4b, 4c and 4d. Further, the intensity of oscillation mode of each element is detected in the form of change of electric current by the near-field light probe 14 or by disposing the photo-electric conversion elements 6 explained with reference to FIGS. 3-5 for the analyzers 4a, 4b, 4c and 4d.

Similarly, other metal nanoparticles 2 are excited with a similar method, and the information of oscillation intensity is obtained for each of the analyzers 4a, 4b, 4c and 4d.

Further, by repeating the foregoing operation, it is possible to obtain the information of the oscillation intensity of each of the analyzers 4a, 4b, 4c and 4d in correspondence to the excitation of each metal nanoparticle 2, and it becomes possible to estimate the direction of the magnetic moment for each of the metal nanoparticles 2 based on the information thus obtained.

Further, with the present embodiment, it is also possible to obtain the function and effect similar to those explained heretofore by replacing a part of the metal nanoparticles 2 with the oscillation mode conversion element 3 and by causing excitation therein.

Further, it is also possible to excite the oscillation mode conversion element 3 by disposing a light-emitting element 5 adjacent to the oscillation mode conversion element 3. In this case, too, similar function and effects as described before are attained.

Otherwise, the present embodiment is identical with other embodiments described heretofore with regard to the construction, function, operation and fabrication method, and description thereof will be omitted.

Tenth Embodiment

Hereinafter, a tenth embodiment of the present invention will be described with reference to the drawings.

Figure 10:
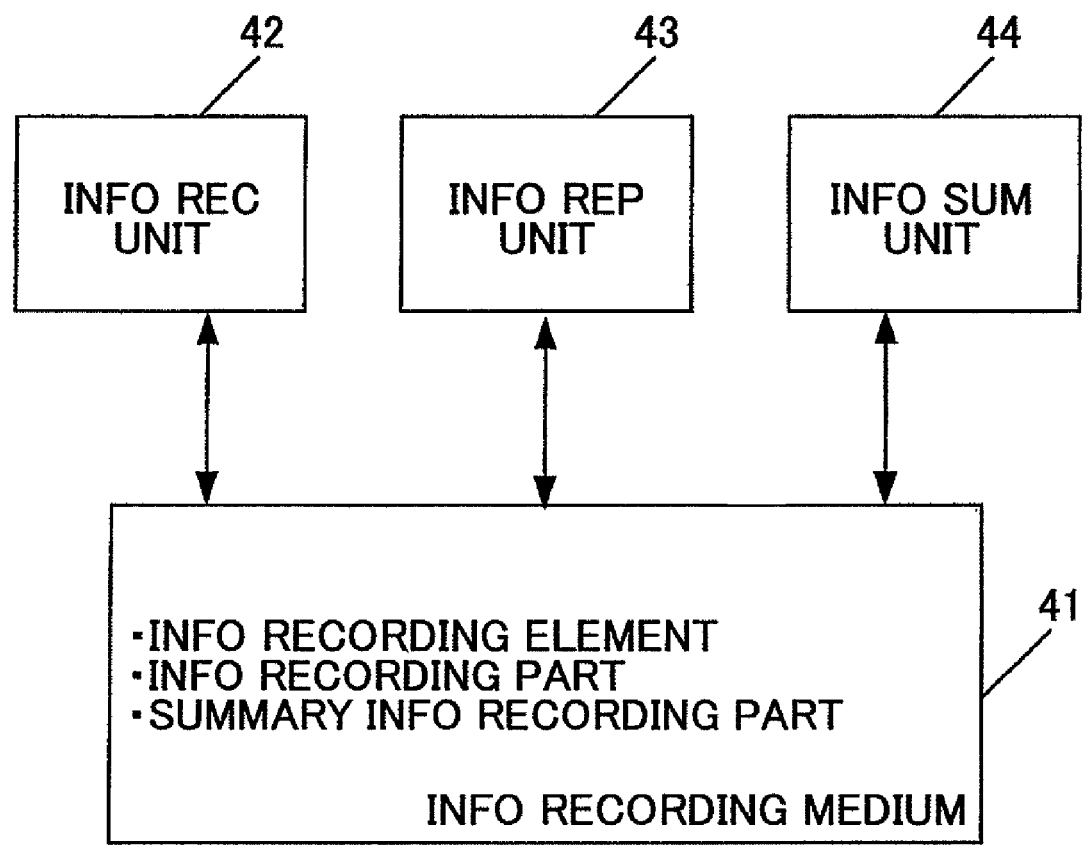
FIG. 10 is a block diagram schematically showing the construction of a fade-in memory according to a tenth embodiment of the present invention.

FIG. 10 is a block diagram showing the schematic construction of the fade in memory according to a tenth embodiment of the present invention.

Referring to FIG. 10, the fade-in memory of the present embodiment includes an information recording unit 42 carrying out recording of information to an information recording medium 41, an information reproducing unit 43 reproducing the recorded information from the information recording medium 41, and an information summarization unit 44 that processes the recorded information for each arbitrarily determined data amount to form summary information summarizing the content of the recording or indicating the feature of the recorded content.

The recording medium 41, on the other hand, includes information recording elements 51, an information recording part 52 and a summary information recording unit 53a, wherein these elements of the information recording medium 41 are not necessarily provided in the same information recording medium 41 but may be provided on different recording media.

Figure 11:
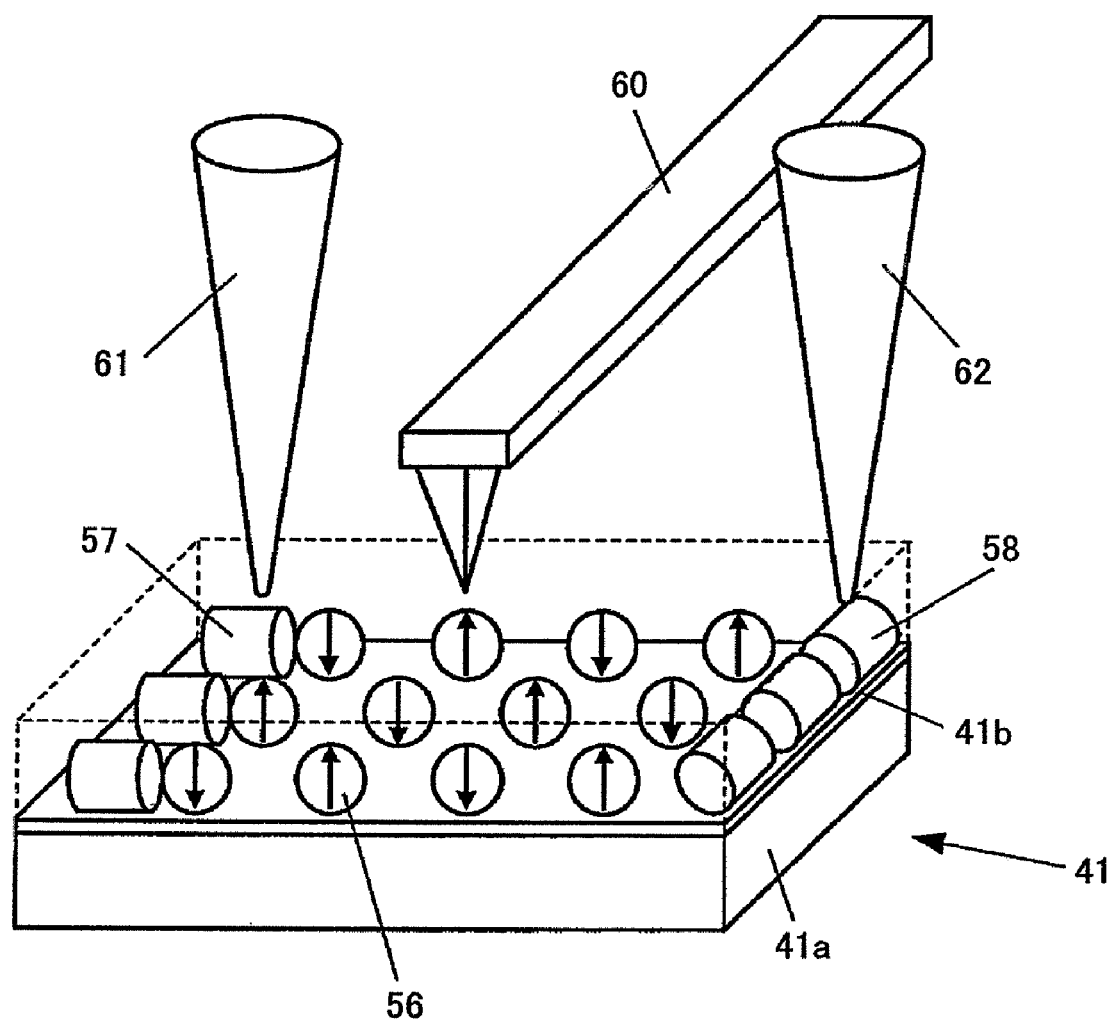
FIG. 11 is a diagram schematically showing the construction of an information recording medium according to the tenth embodiment.

The information recording medium 41 used for the fade-in memory of the present embodiment is a solid state memory not using a floating head and comprises a recording medium in which metal nanoparticles 56 or spin nanoclusters shown in FIG. 11 are arrayed on a semiconductor chip with nano-scale size by self-organizing process.

With the information recording element 51, this spin nanocluster becomes the fundamental unit of the information recording, and recording of information is achieved by way of current-inducted magnetic switching caused by a field-emission cathode array of a half metal material. Further, reproducing of the information is based on the principle of reading out the spin alignment information of the recording medium by the propagation of the near-field light formed by near-field light exchange elements 57 produced by nano-fabrication technology.

Thus, with the information recording apparatus 41 of the present embodiment, it is possible to write and read information of plural bits simultaneously, by disposing plural recording heads 60 of field emission elements fabricated by nano-fabrication technology of semiconductor devices, sources 61 of near-field light and detectors 62. With such a construction, it should be noted that it is possible to change the degree of accuracy according to the time for reading by changing the number of the near-field lights to be introduced at the time of reproducing of the information. This function is particularly notable as the function of fade-in reading.

Further, laser diodes and photodiodes are integrated respectively as the sources 61 and detectors 62 of the near-field light to form an array by using the semiconductor integration technology with the order of nanometers.

Here, it should be noted that the source 61 produces a near-field light by injecting a laser beam of controlled polarization to a tip end part thereof. On the other hand, with regard to the detectors 62, photodetection is achieved by a photodiode via a near-field light amplifier that uses the technology of surface plasmon.

For example, the fine particles of spin nanocluster of the size of 0.8 nm, for example, are arrayed by a self-organizing process to form the recording medium. In such a case, the spins of the spin nanocluster represent the recorded information. Further, the array of the self-organized particles also forms the waveguide of the near-field light.

For writing spin information, a recording head (writing head) 60 is used, wherein the recording head 60 includes an array of field emission cathodes of half metal material. It should be noted that a half metal material used herein is a ferromagnetic material having an electronic structure similar to that of a metal for up-spin electrons and an electronic structure similar to that of an insulator for down-spin electrons. More specifically, the spin direction is reversed in the spin nanocluster (metal nanoparticle 56) by irradiating the spin nanocluster with a beam of spin-polarized electrons (spin current) produced by the field emission cathode after focusing to a size of 1 nm or less.

Because the recording head of the present embodiment can focus the spin current to the size of 1 nm or less, contrary to the conventional recording head in which the gradient of applied magnetic field or thermal conduction of the medium becomes the limiting factor, it becomes possible with the present embodiment to realize ultra high-resolution recording to the sub-nanometer recording medium of petabyte class.

The near-field light propagating through the array of spin nanocluster at the time of reading of spin information propagates by way of exchange of surface plasmon. Thereby, it should be noted that, because each cluster has its own spin, the near-field light under propagation experiences modulation as a result of magneto-optic effect. Thus, the near-field light experiences constant modulation and attenuation as it propagates through each of the clusters, it becomes possible to detect the spin information of the cluster array serving for the waveguide path based on the modulation state of the near-field light directed to the cluster immediately before the detector.

Further, because the spin nanocluster form a two-dimensional array, it is possible to obtain the spin information for plural clusters in the array simultaneously, by injecting the near-field light from plural near-field light sources.

Further, it should be noted that the near-field light introduced from a single source not only propagates through a particular cluster array straight to the detector, but it also propagates to adjacent arrays.

Thus, it is possible to roughly detect the spin state for the overall array of the self-organized spin nanocluster even when the injection of the near-field light is made at sparse sites at the time of reading.

This also means that it becomes possible to carry out reproducing of outline information at first by high-speed accessing and gradually reproducing detailed information by taking time, by increasing the site of injection of the near-field light. This is nothing but the feature and function of fade-in memory.

Further, a signal processing part is provided to the fade-in memory for carrying out in/out control of information in the form of a semiconductor integrated circuit, wherein the semiconductor integrated circuit controls over all aspects of signal reproducing system of "electrical signal—near-field light—spin—near-field light—electrical signal, and carries out the operation of causing the hardware to function as a "fade-in memory" based on an optimum algorithm.

Thus, the fade-in memory of the present embodiment has the construction optimum for the function of fade-in. Because a near-field light propagates by scattering or diffusion while interacting with the adjacent spin nanocluster, it allows reading of the spin information of such adjacent spin nanocluster at the same time.

Further, by providing the summary information recording region, it becomes possible with the present embodiment to summarize the information of plural information recording elements corresponding to the summary information recording region and hold the same in the form of summary information of these plural information recording elements.

Here, the construction of the reproducing function of the fade-in memory of the present embodiment will be described with reference to the schematic diagram of FIG. 12.

Figure 12:
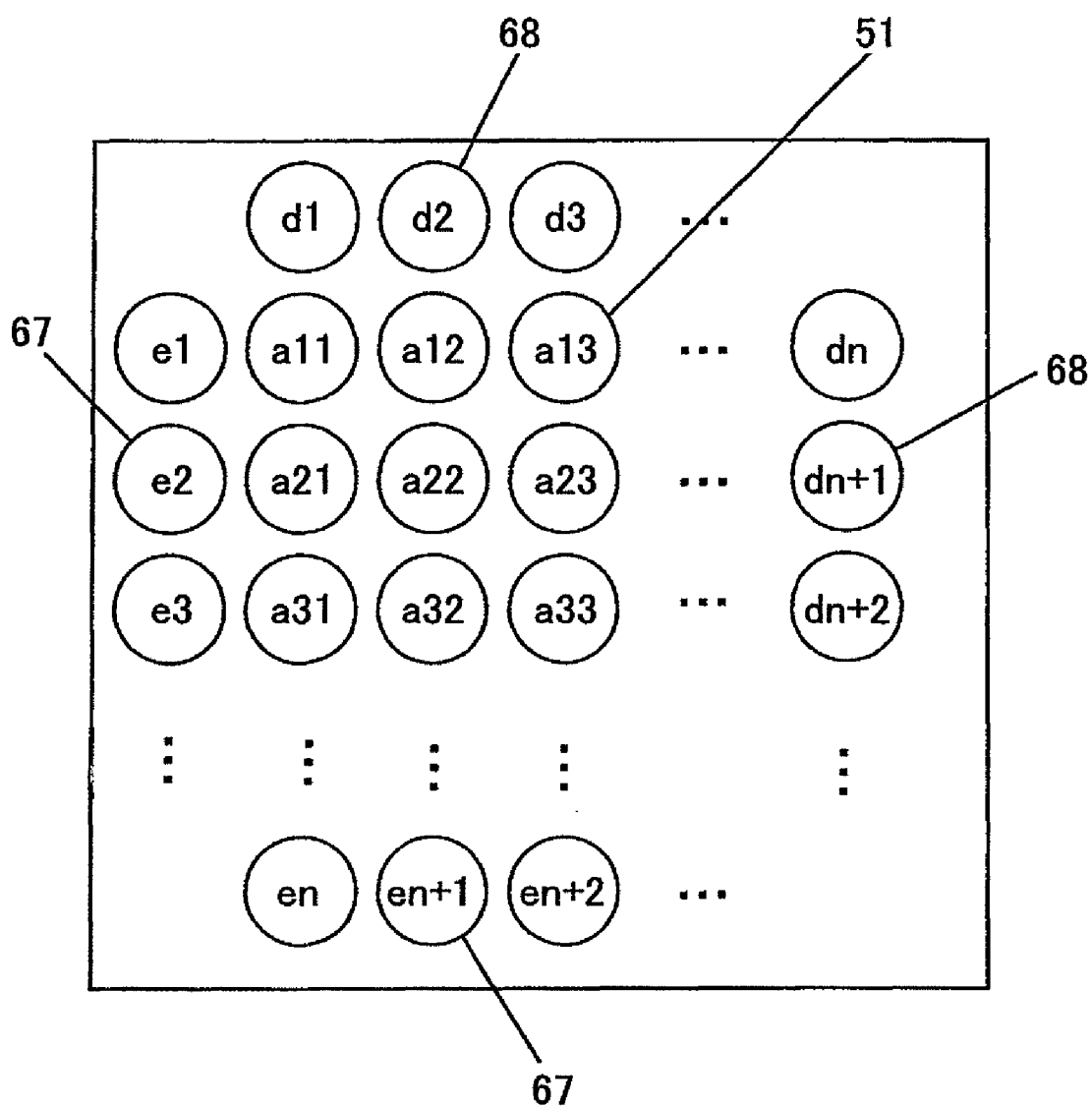
FIG. 12 is a diagram explaining the reproducing function of a fade-in memory device.

Referring to FIG. 12, it can be seen that plural information recording elements 51 are arrayed in row and column formation, and plural emitters 67 and plural collectors 68 are disposed along the edges of the array of the information recording elements 51. While the example of FIG. 12 shows a row and column formation formed on a plane for the array of the information recording elements 51, the array of the information recording elements 51 is not limited to such a row and column formation and it is also possible to use hexagonal closed packing (honeycomb) structure or a random structure. Further, the array of the information recording elements is not limited on a plane but it is also possible to form the array on a spherical surface or in a three-dimensional space.

Further, any material can be used for the information recording element 51 as long as it can record information, and it is possible to use a ferroelectric material or phase change material in place of the minute magnetic material such as spin cluster used in the illustrated example.

In the explanation hereinafter, the present invention will be explained for the case of a memory that stores one bit of information in the form of spin direction of a spin nanocluster.

In the example of FIG. 12, the emitters 67 are disposed outside the array of the information recording elements 51, while it is also possible to dispose the emitters 67 inside the array. Similarly, the collectors 68 are disposed outside the array of the information recording elements 51, while it is also possible to dispose the collectors 68 inside the array.

At the time of reproducing of the information, the emitter 67 emits energy, while it should be noted that this energy emitted from the emitter 67 may be any of light such as near-field light or plasmon that propagates through the minute regions, in addition to ordinary propagation light.

Response of material to electromagnetic wave including light is described by using dielectric constant $\in$ and permeability $\mu$. In the case of transparent material existing in the nature, the dielectric constant $\in$ and the permeability $\mu$ take a positive value, and the refractive index n ($=\sqrt{\in\mu}$) becomes a real number.

In order to be optically transparent, the refractive index n has to be a real number, while in the case of the substrate having a refractive index represented by imaginary number, the material becomes an opaque material.

On the other hand, in the case the dielectric constant $\in$ and the permeability $\mu$ take both a negative value at the same time, the refractive index n becomes a real number and electromagnetic wave can propagate through such a material. Reference should be made to Non-Patent Reference 7.

In the case of the electromagnetic wave propagating through such a material, there holds a left-hand relationship with regard to the electric field, magnetic field and wave vector, and because of this, such materials are called LHMs (left handed materials).

Because LHMs have a negative group velocity and negative refractive index (see Non-Patent Reference 8), it is expected that such a material exhibits strange phenomenon such as inverse Doppler Effect or inverse Cherenkov radiation. Further, by using such a material, it is thought that a totally novel optical element capable of focusing near-field light can be realized.

For the material having a permeability $\mu$ of negative value, there is a ferromagnetic composite film in which ferromagnetic metal nanoparticles are embedded in an insulator matrix (Non-Patent Reference 5). With such a material, it is possible to realize a negative permeability $\mu$ for microwaves by using ferromagnetic resonance (FMR).

In more detail, such a composite film functions as LHM in the frequency region near ferromagnetic resonant frequency, provided that the volumetric packing ratio of the ferromagnetic metal nanoparticles is adjusted and the direction of magnetization is aligned in one direction. In the spectrum of electromagnetic wave, microwave region is the frequency region near the ferromagnetic resonant frequency. The present invention may use such an LHM for the information recording medium of the fade-in memory. On the other hand, the wavelength of the optical source is not limited to microwave, and it is possible to use an optical source of visible light or blue to violet color having the wavelength of about 400 nm. In the case of the recording medium of LHM, the near-field light emitted from the emitter can be focused inside the medium and it is possible to cause the light to propagate over a relatively long distance without causing attenuation by diffusion of the light.

Here, the energy E emitted from the emitter 67 shown in FIG. 12 will be designated as:

$$E=\{e_j\}. \quad (7)$$

Further, in the case one bit information recorded into the information recording element 51 is related to the orientation of the electron spin of the spin nanocluster, the information A recorded into each information recording element 51 is represented as $$A=\{a_{ij}\} \quad (8)$$

Now, the energy E emitted from the emitter 67 at the time of reproducing propagates through the information recording elements 51 while causing mutual interaction therewith. In the case the energy E is a near-field light, the near-field light thus reached the spin nanocluster constituting the information recording element 51 causes excitation of surface plasmon on the cluster surface by interacting with the metal layer at the surface of the cluster.

More specifically, the surface plasmon interacts with the spin of the spin nanocluster 51, and the surface plasmon thus holding the information of the spin state of that spin nanocluster propagates to the next spin nanocluster and causes interaction with the spin state of this spin nanocluster.

Thus, by repeating the interaction between adjacent spin nanoclusters, the surface plasmon finally reaches the collector 68 adjacent to the final spin nanocluster, wherein the surface plasmon thus reached the final spin nanocluster holds the information of the spin states of the spin nanocluster along the propagation path. Thereby, the collector 68 detects the surface plasmon and produced a detection signal D represented as $$D=\{d_j\}. \quad (9)$$

Further, it should be noted that the relationship between the detection signal D of the detected plasmon and the energy E emitted from the emitter 27 is represented, by using the magnetization information A of the spin nanocluster constituting the information recording elements 51, as follows:

$$D=AE. \quad (10)$$

Thus, the magnetization information A of the spin nanoclusters can be calculated by using the detection signal D of the plasmon and the energy E emitted from the emitter 67 as follows:

$$A=DE^{-1}. \quad (11)$$

Here, it should be noted that the magnetization information matrix A has to be linearly independent and that orthogonal relationship holds between all of the elements of the matrix A.

The calculation of the equation (11) may be conducted by using CT (computer tomography) or may be solved as simultaneous equations. In the latter case, the detectors of the plasmon detection signals D have to be provided with the number equal to or larger than the number of the elements of the spin nanocluster magnetization matrix A.

Next, procedure of recording and reproducing of information in the fade-in memory of the present embodiment will be described.

Figure 13:
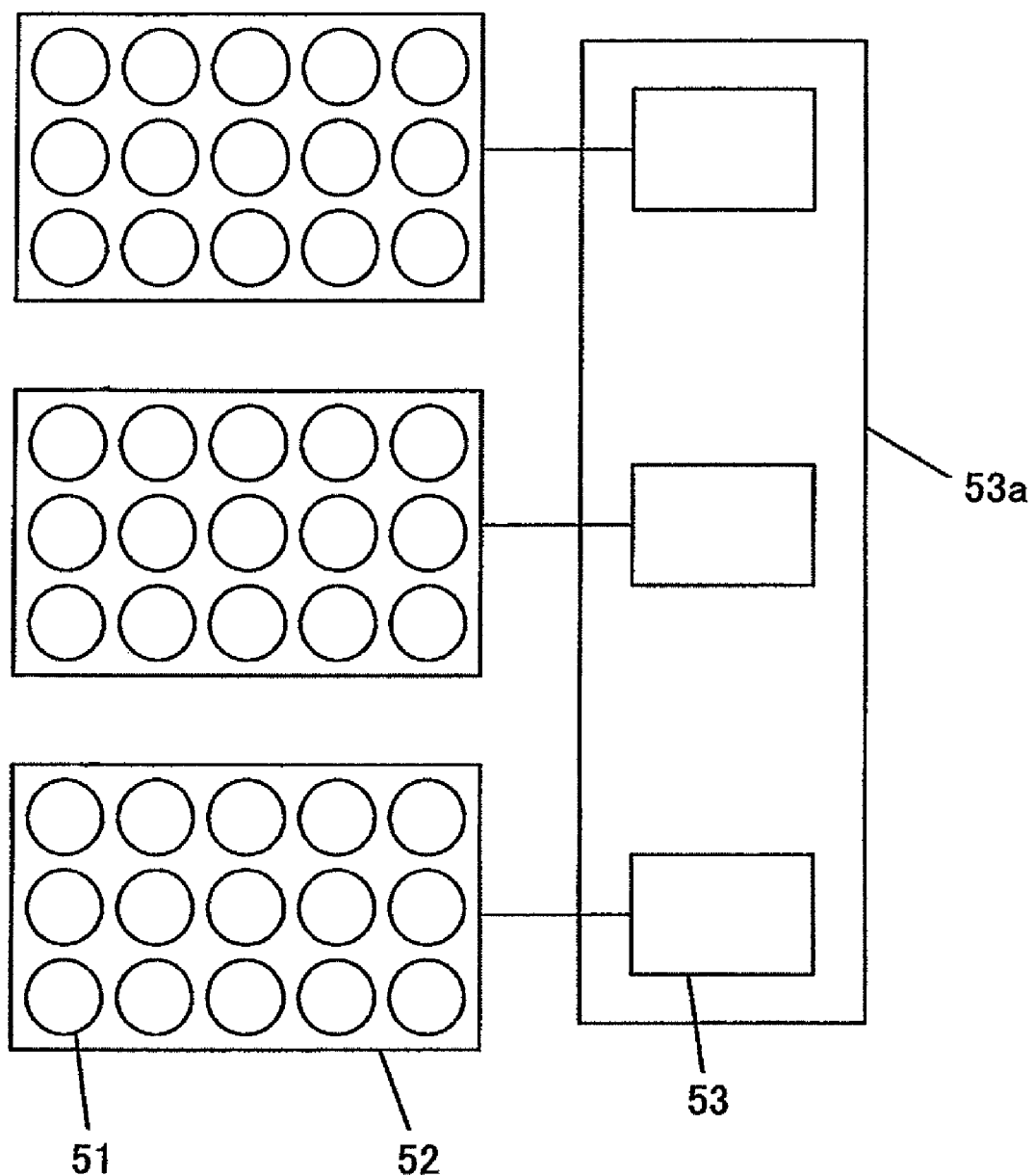
FIG. 13 is a diagram schematically showing the construction of an information recording medium used with the fade-in memory of the tenth embodiment.

First, recording of information will be described with reference to FIG. 13 showing the case of recording information into an information recording medium comprising an information recording part 52 formed the information recording elements 51 provided in plural number, and summary information recording unit 53*a* recording therein summary information 53 that summarizes plural pieces of information. Further, FIG. 14 is a flowchart showing the processing for recording information of the tenth embodiment of the present invention.

Figure 14:
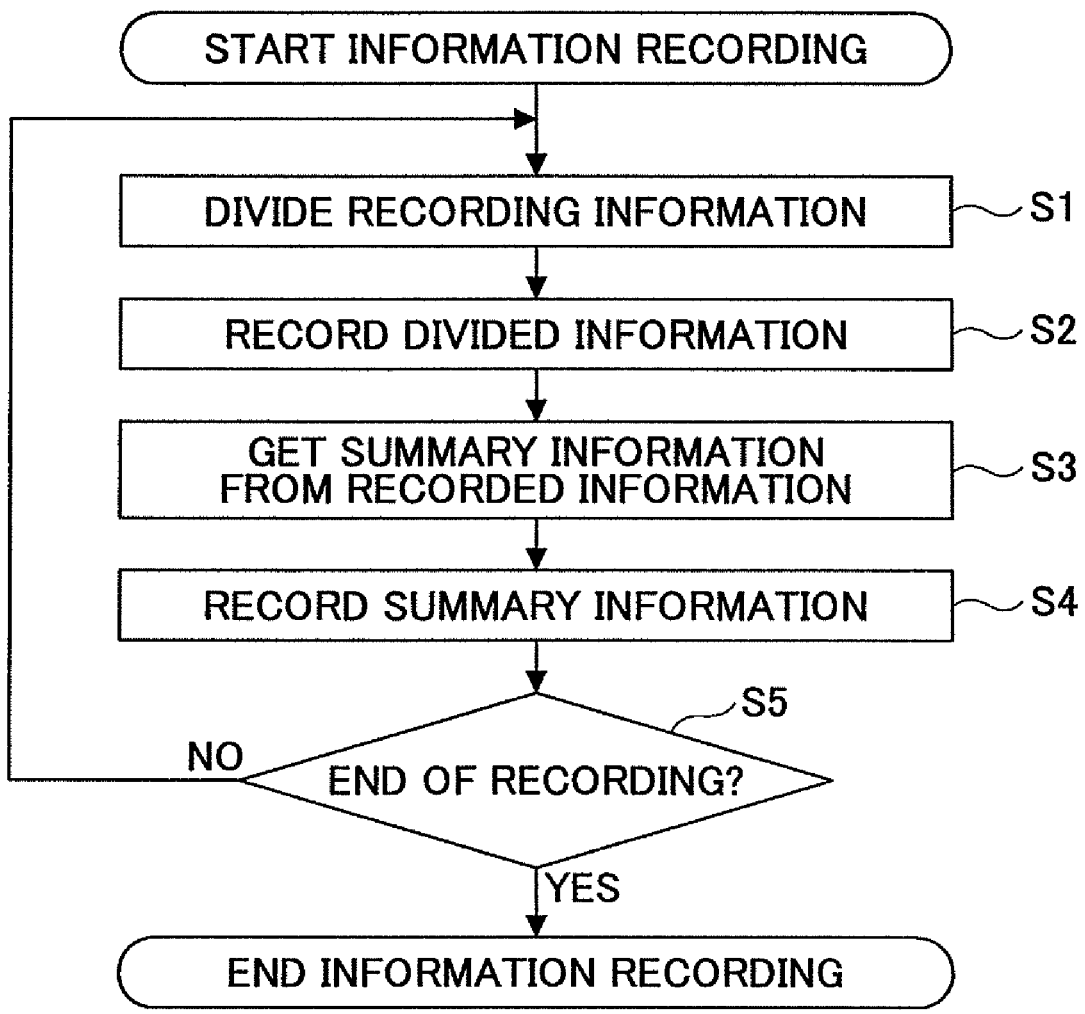
FIG. 14 is a flowchart showing the information recording processing according to the tenth embodiment of the present invention.

Referring to FIG. 14, the information recording unit 42 shown in FIG. 10 is used, upon commencement of recording of information, to divide the information to be recorded to the information recording medium 41 in the step S1, and the divided information is recorded to the information recording elements 51 of the information recording part 52 in the step S2.

Further, in the step S3, the information to be recorded into the information recording part 52 is subjected to a dummy processing in the information summarizing unit 44 and resultant summary information 53 is acquired.

Next, in the step S4, this summary information 53 is recorded into the summary information recording unit 53*a*, and check is made in the subsequent step S5 as to whether or not the processing of the information to be recoded is completed for all the divided information.

If not, ("NO" in the step S5), the process returns to the step S1 for the processing of the next divided information, while if yes ("YES" in the step S5), the processing of the information is terminated.

Here, it should be noted that the division of the information may be conducted such that the divided information has a size equal to the amount of information to be recorded in the information recording part 52. Alternatively, the size may be determined based on the nature of the information to be recorded. In the case of the motion picture information, for example, the information may be divided on the time axis in view of the nature of data stream of the information.

Further, in the information summarizing unit 44, it is possible to record the information recorded to the information recording part 52 to the summary information recording unit 53*a* after coarse acquisition by utilizing the properties of the fade-in memory of the present invention as explained previously, in the form of summary information 53.

Figure 15:
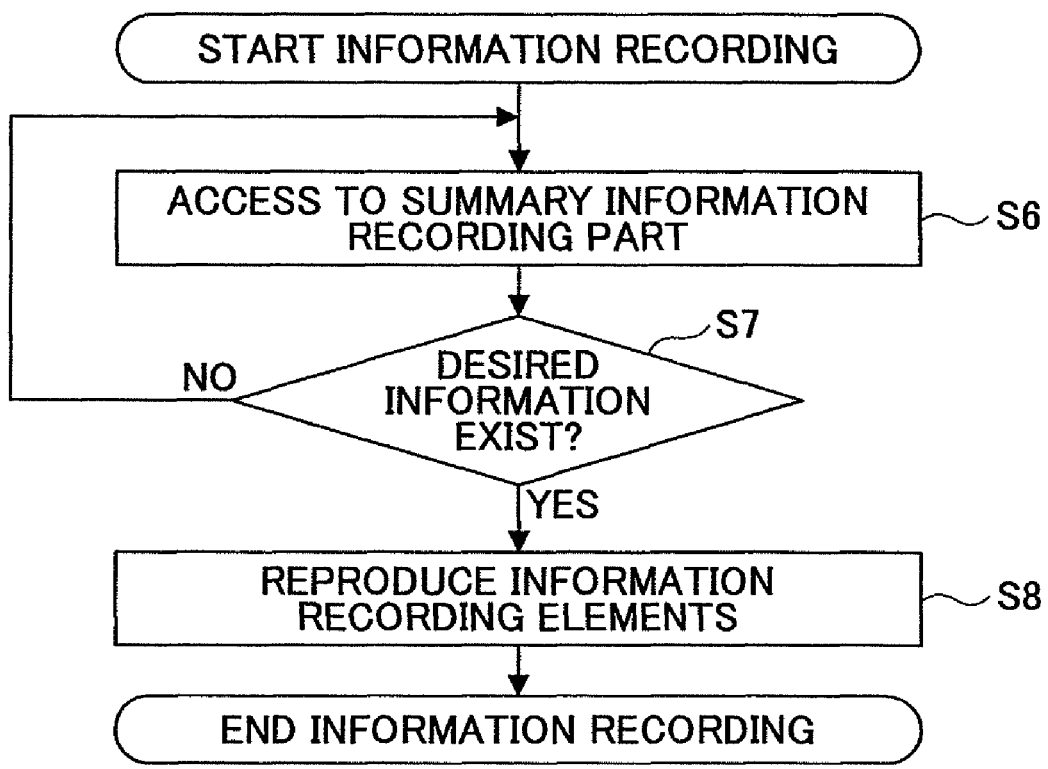
FIG. 15 is a flowchart showing the information reproducing processing according to the tenth embodiment of the present invention.

Next, reproducing of information will be explained with reference to the flowchart of FIG. 15 showing the processing of information reproduction.

Suppose now the case in which the information recording medium shown in FIG. 13 is recorded with the information to the information recording part 52 of the plural information recording elements 51 and further with the summary information recorded to the summary information recording part 53*b* as the summarization of the information recorded to the information recording part 52.

At the time of reproducing of the fade-in memory, the information reproducing unit 43 shown in FIG. 10 first accesses the summary information recording unit 53*a* in the step S6 and judges, in the step S7, as to whether or not the desired information is included in the information recording part 52 corresponding to this summary information 53.

In the case the desired information is not recorded to the information recording part ("NO" in the step S7), the process returns to the step S6 for accessing to other summary information 53 or other summary information recording unit 53*a* without reading information from the information recording elements 51 in search of the desired information.

If the desired information is recorded in the current information recording part 52 ("YES" in the step S7), on the other hand, accessing is made to the information recording elements 51 of this information recording part 52 in the step S8 and reading of the desired information is achieved.

With this, the present embodiment solves the problem of efficiency of search and accessibility arising with the increase of storage capacity of the information recording medium and enables high speed reproduction of information.

Further, it should be noted that, in the reproducing of the plural summary information 53 recorded to the summary information recording part, too, it is possible to accelerate the speed of reproducing processing by coarsely acquiring the content of the summary information 53 and by selecting one of the plural summary information recording units 53*a*.

Eleventh Embodiment

Figure 16:
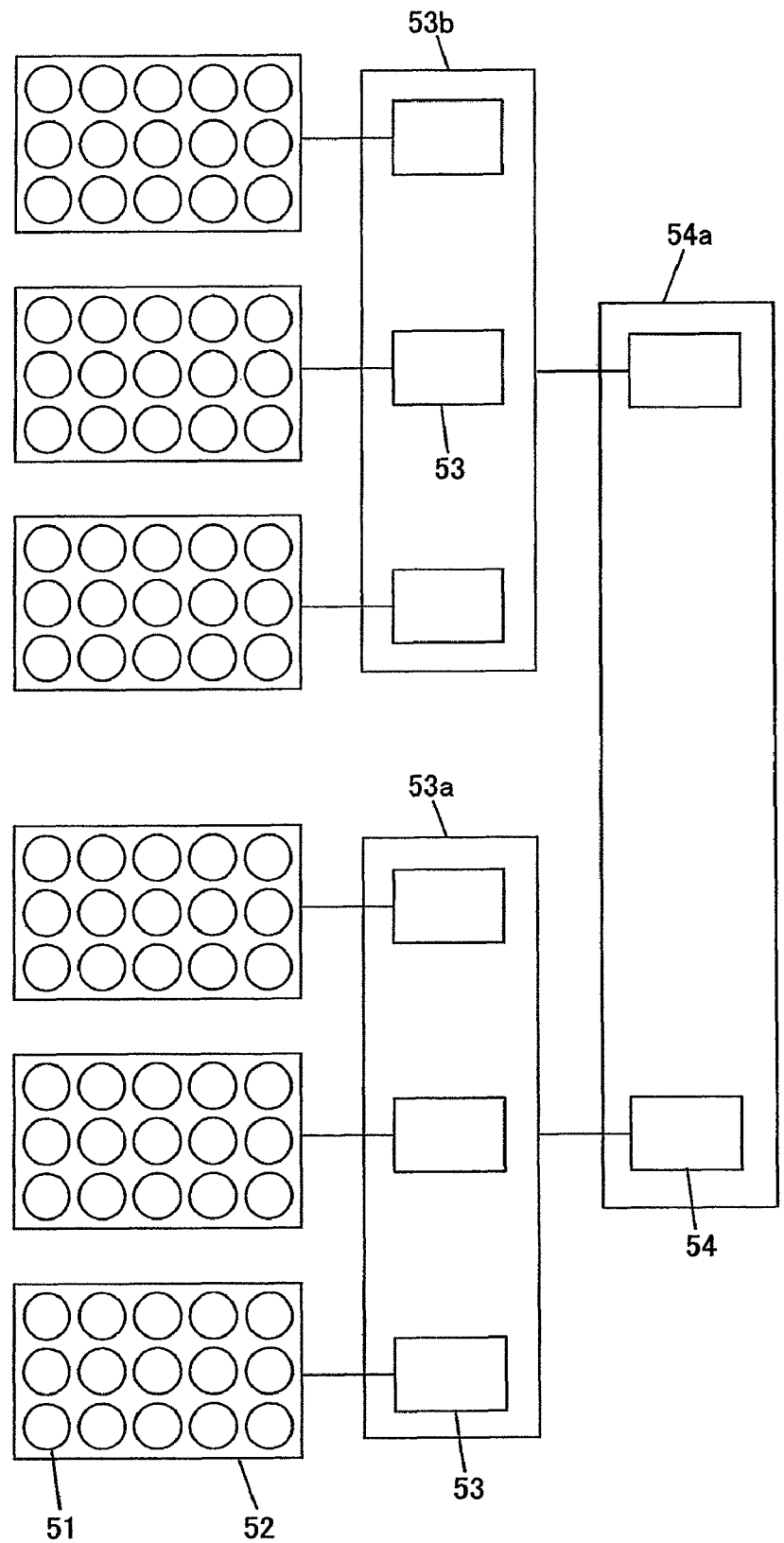
FIG. 16 is a diagram schematically showing the construction of an information recording medium used for a fade-in memory according to an eleventh embodiment of the present invention.

FIG. 16 is a diagram showing the construction of an information recording medium according to an eleventh embodiment of the present invention forming a fade-in memory.

Referring to FIG. 16, the fade-in memory includes the summary information recording unit 53*a* serving for the summary information recording region recording therein the summary information of the tenth embodiment described previously as a first summary information part, and a plurality of such summary recording unit 53*a* are gathered together to form a second summary information recording part 54*a* recording summary information 54 recording a summary of the plurality of first summary information recording units 53*a*. Thus, the second summary information recording part 54*a* has a region for recording the summary information of the plurality of first summary information recording units 53*a*.

With such a construction, it is also possible to provide a third summary information recording part for recording summary information of the second summary information recording parts and it is further possible to expand this hierarchical structure to include further layers.

Next, recording and reproducing process conducted with such a fade-in memory to carry out recording and reproducing of information to and from an information recording medium will be described.

First, recording of information will be described with reference to FIG. 16 showing the case of recording information to an information recording medium formed of the information recording parts 52 each including therein plural information recording elements 52, the first summary information recording units 53a and 53b each recording the summary information 53 of the information recording part 52 of the lower hierarchy, and the second summary information recording part 54a that records the plural summary information 54 each summarizing the plural summary information 53 of the lower hierarch.

Figure 17:
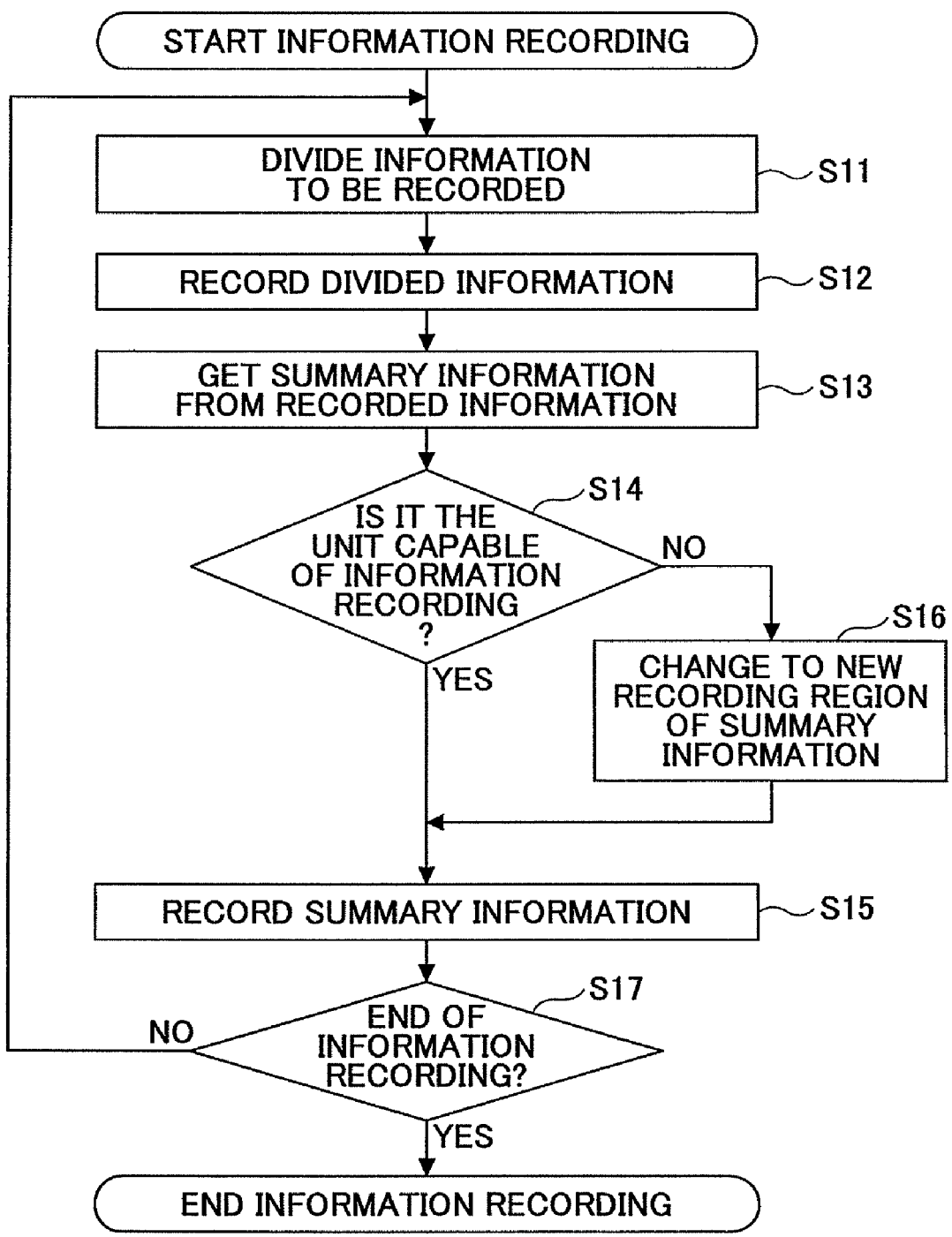
FIG. 17 is a flowchart showing the information recording processing according to an eleventh embodiment of the present invention.

Further, FIG. 17 is a flowchart showing the processing of the information recording method according to the eleventh embodiment.

Referring to FIG. 17, the information to be recorded is divided by the information recording unit 42 shown in FIG. 10 in the step S11 upon commencement of recording of information, the divided information is recorded to the information recording elements 51 of the information recording part 52 in the step S12. Further, in the step S13, the information recorded to the information recording part 52 is subjected to the summarizing processing by the information summarizing unit 44 and the summary information 53 is acquired.

Next, in the step S14, it is confirmed whether or not there exists a region in the region of the first summary information recording part 53b in which the summary information 13 is recordable, and it such recording is possible ("YES" in the step S14), the acquired summary information 53 is recorded to the first summary information recording part 53 in the step S15.

On the other hand, if such recording is not possible ("NO" in the step S14), a now first summarizing information recording unit 53b (see FIG. 16) is selected, and the process proceeds to the step S15 for carrying out the recording of the acquired summary information 53 (step S16).

In this processing S16, the processing similar to that of the step S13 is carried out, and the summary information 14 summarizing the recorded summary information 53 is obtained. The summary information 14 thus obtained is recorded to the second summary information recording part 54a.

Next, after it is confirmed whether or not the processing is completed for all the information to be recorded in the step S17, the process returns to the step S11 for processing the next divided information if it is judged that the processing is not completed ("NO" in step S17). Further, when it is confirmed that all the information has been processed ("YES" in the step S17), recording of the information is completed.

In the first summary information part 53a, the region for recording the summary information 53 may have a size generally equal to the size of the information recording part 52, while the present invention is not limited to such a particular construction. With this, the processing for creating the summary information in the information summary unit 44 may be achieved by a similar process.

Further, it is possible to use the summary information recording part commonly by the information recording part and by the recording region of the information with such a construction that the summary information is recorded in the early half part of the summary information recording part and the detailed information is recorded in the latter half part of the summary information recording part.

Further, in the finalizing step. S17, confirmation is made at the time of recording the summary information 53 to the summary information recording unit 53a in the step S14 whether or not the summary information 53 is within the recordable unit, and the summary information 54 of the summary information recording part 53a is obtained. Further, by recording the same to the second summary information recording part 54a, the operation of recording is completed.

Figure 18:
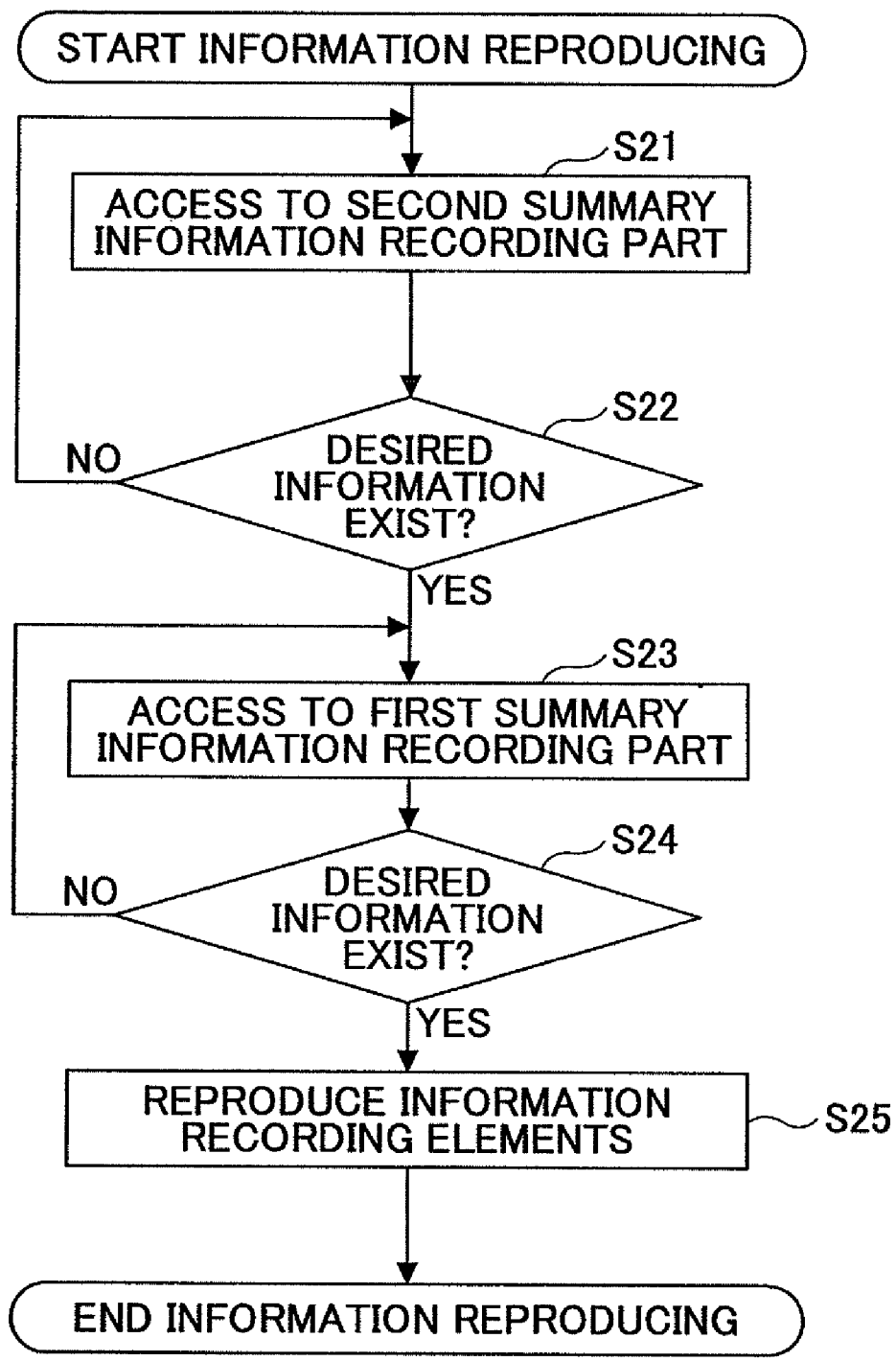
FIG. 18 is a flowchart showing the information reproducing processing according to the eleventh embodiment of the present invention.

Next, reproducing of information will be explained based on the flowchart shown in FIG. 18 representing the process of information reproduction.

Consider now the case of the information recording medium of FIG. 16, in which information is recorded to each of the information recording parts 52 each in turn formed of the plural information recording elements 51, the summary information 53 summarizing the information of plural information recording elements 51 is recorded to the first summary information recording parts 53a and 53b as the summary information 53, and the summary information further summarizing the information 53 of the first summary information recording parts 53a and 53b is recorded to the summary information recording part 54a.

For the reproducing of information by way of fade-in memory, the information recording unit 43 shown in FIG. 10 first accesses to the second summary information recording part 54a in the step S21 and judges as to whether or not the desired information exists in the first summary information recording part 53a corresponding to this second summary information recording part 54a.

In the event the desired information is not recorded to first summary information recording part 53a ("NO" in the step S22), the processing returns to the step S21 without reading information from that first summary information part 53a, and seeks for the desired information for accessing another first summary information recording part 53b via the second summary information recording part 54a.

On the other hand, in the case the desired information is recorded to the first summary information recording part 53a ("YES" in the step S22), access is made to the first summary information recording part 53 in the step S23, and judgment is made as to whether or not the desired information exists in the information recording part 52 corresponding to that summary information 53.

In the case the desired information is not recorded to the current information recording part 52 ("NO" in the step S24), the process returns to the step S23 and access is made to the next information recording part 52. On the other hand, in the case there exists the desired information ("YES" in the step S24), access is made to the information recording elements 52 in the step S25 via the recording part 52 and reproducing of the desired information is achieved. With this, the demand of high speed search and high speed access demanded in the information recording medium of extremely large capacity is attained successfully, and high-speed reproducing of information becomes necessary.

Twelfth Embodiment

Figure 19:
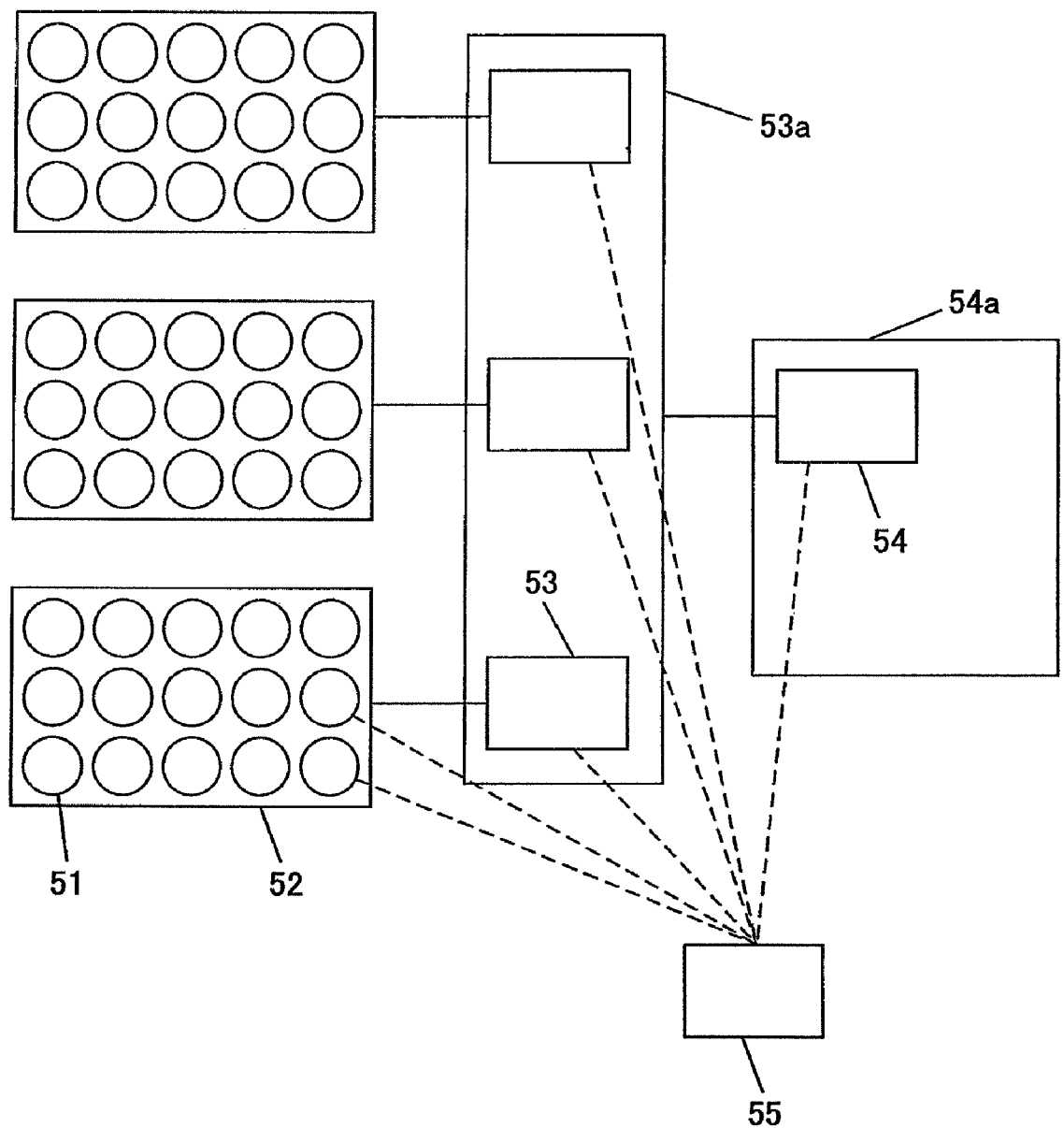
FIG. 19 is a diagram showing the schematic construction of an information recording medium used for the fade-in, memory according to the eleventh embodiment of the present invention.

FIG. 19 is a diagram showing the construction of an information recording medium according to a twelfth embodiment of the present invention, wherein those parts corresponding to the parts described previously are designated by the same reference numerals and the description thereof will be omitted.

It should be noted that the fade-in memory of the present embodiment has a construction similar to that of the tenth and eleventh embodiments, except that there is additionally provided a relation information recording part 55 recording relation information between each information recording element and each summary information.

Thus, referring to FIG. 19, the relation information recording part 55 is provided for recording the relationship between the summary information 53 and the summary information 54 or between the summary information 53 and the information recording elements 51, by stacking the summary information 53 and the summary information 54, or further stacking plural summary information recording parts. It should be noted that such relation information recording part 55 records the relation information between the summary information 53 and the summary information 54 and further between the information recording elements 51.

Hereinafter, the information processing of the fade-in memory of the present embodiment for recording or reproducing information to or from the information recording medium will be explained.

First, consider the case of recording information to the information recording medium shown in FIG. 19, in which the information recording medium 52 of FIG. 19 holds the information recorded to the information recording part 52 including therein the plural information recording elements 51, the summary information 52 summarizing the information recorded to the information recording part 52 and recorded to the second summary information recording part 54a, and the information indicative of the relationship therebetween is recorded to the relation information recording part 55.

Figure 20:
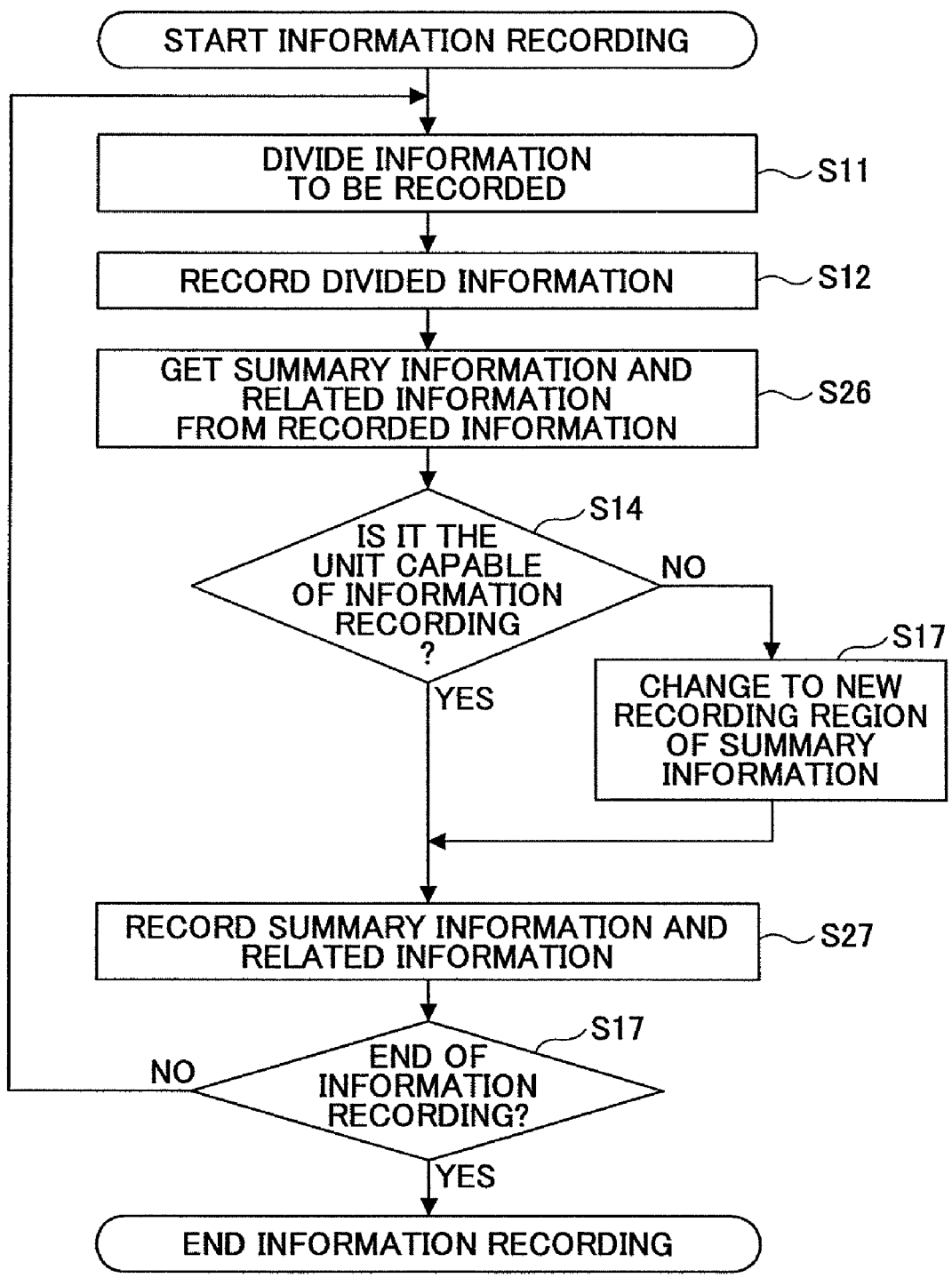
FIG. 20 is a flowchart showing the information recording processing used with a twelfth embodiment of the present invention.

FIG. 20 shows the flowchart showing the processing of the information recording part 52 of the present embodiment.

Referring to FIG. 20, a processing similar to the processing of the previous eleventh embodiment is carried out upon commencement of the information recording, wherein those processing corresponding to the processing explained in FIG. 17 will be designated by the same reference numerals.

Referring to FIG. 19, dividing of the recording information is achieved in the step S11, and the divided information is recorded to the information recording elements 51 of the information recording part 52 in the step S12.

Further, in the step S26, the information recorded to the information recording part 52 is subjected to the summary processing by the information summary unit 44 to acquire the summary information 53 further the relationship information between the recorded information recording elements 51.

Further, confirmation is made in the step S14 as to whether or not the summary information recorded to the recording region of the summary information recording part is a recordable unit or not, and a new summary information recording part 53b (see FIG. 19) is selected based upon the result of the step S14. Further, the process proceeds to the step S27 from the step S16 for carrying out recording of the acquired summary information 53.

In the step S27, the first summary information 53 acquired in the step S26 is recorded to the summary information recording part 53a. Further, the relation information acquired at the same time and further the relation information at the time of recording the summary information 53 to the summary information recording part 53a are acquired and recorded to the relation information recording part 55.

Further, in the step S17, confirmation is made as to whether or not all the processing of the recording information is completed, and recording of the information is terminated. For this relation information, the information of the physical location of the information recording elements 51 or the summary information 53, 54 on the information recording medium may be acquired and recorded.

Figure 21:
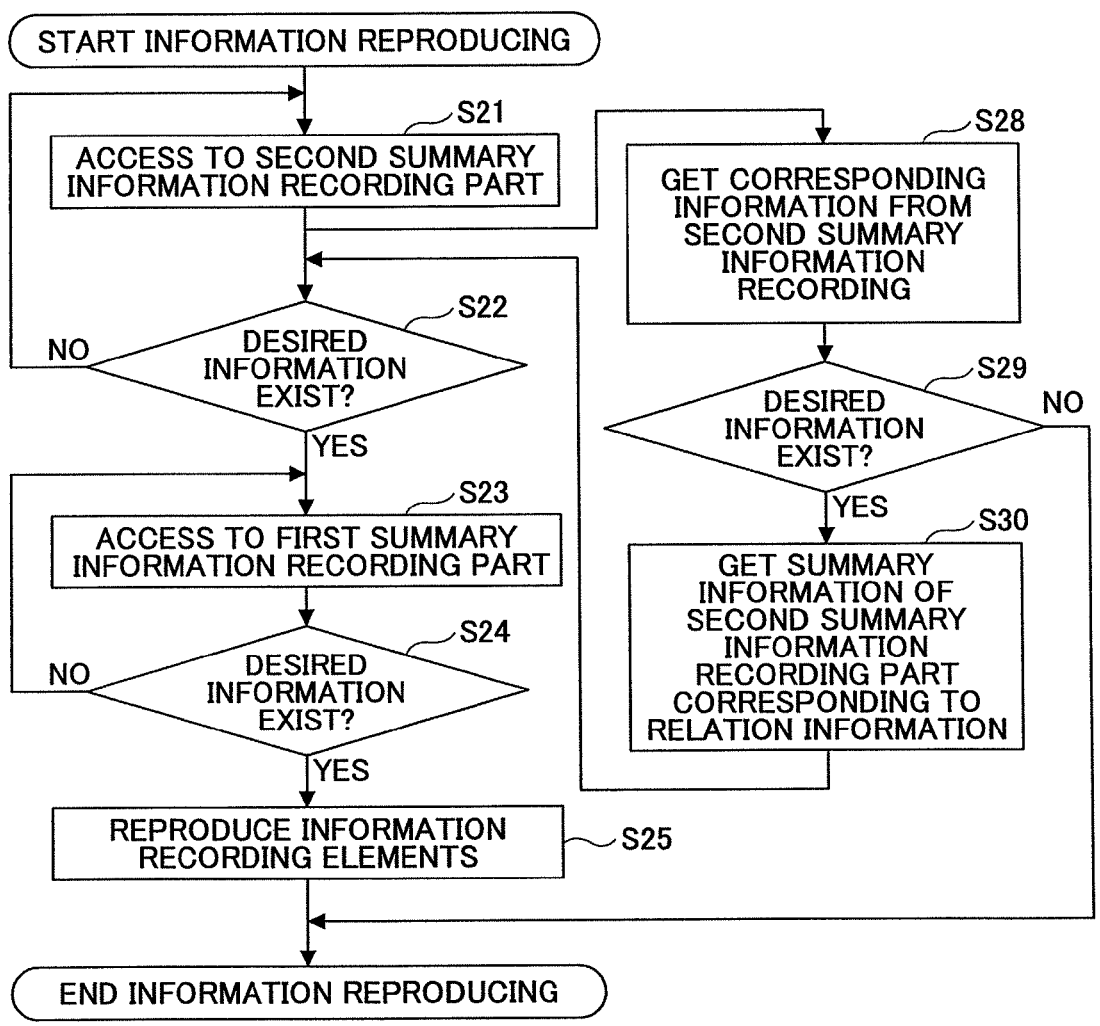
FIG. 21 is a flowchart showing the information reproducing processing used with the twelfth embodiment of the present invention.

Next, reproducing of the information will be explained based on the flowchart of FIG. 21 showing the information reproducing process of the present embodiment, wherein those parts corresponding to the parts described previously with reference to FIG. 18 are designated by the same reference numerals and the description thereof will be omitted.

At the time of reproducing information with the fade-in memory of the present embodiment, access is made in the step S21 at first to the second summary information recording part 54a and the relation information corresponding to the second summary information recording part 54a is acquired from the relation information recording part 55 in the step S28. Further, judgment is made with regard to whether or not there exists the desired information in the summary information 13 corresponding to the acquired relation information inside the first summary information recording part 53a.

In the event the desired information is not recorded in the first summary information recording part 53a ("NO" in the step S29), the processing is terminated without reading information from the first summary information recording part 53a based on the related information.

On the other hand, if the desired information is recorded in the first summary information recording part 53a ("YES" in the step S29), judgment is made as to whether or not there exists the desired information in the first summary information recording part 53a corresponding to the second summary information recording part 54a under consideration.

Thereafter, access is made to the first summary information recording part 53a in the step S23 similarly to the process of FIG. 18 explained before, and judgment is made as to whether or not there exists the desired information in the corresponding information recording part 52.

If the desired information is not recorded to the information recording part 52 ("NO" in the step S24), the process returns to the step S23, and access is made to the next information recording part 52.

Further, in the case the desired information exists ("YES" in the step S24), access is made to the information recording elements 51 via the information recording part 52 in the step S25, and with this, reproducing of the desired information is attained.

Here, it should be noted that the steps S28-S30 shown in FIG. 21 of the twelfth embodiment may be conducted after the step 23 with the present embodiment. Alternatively, it is possible to carry out both processing at the same time or selectively. With this, the demand of high-speed search and accessing required for the information recording media of enormous storage capacity is successfully resolved and high speed reproducing of information is realized.

Particularly, in the case the information to be recorded and reproduced is image data or motion picture data, it becomes possible to organize the pixel information in the form of hierarchical structure, while this allows search of desired detailed image information consecutively, by starting from the summary information recording region corresponding to the top hierarchical structure.

According to such a reading process, it becomes possible to read out the summary information from the summary information recording region at first for examination as to whether or not the desired information is recorded in the information recording part corresponding to the current summary information recording region, wherein such a process allows interruption of the operation for reproducing the detailed information in the event the current region does not contain the desired information. The reproducing of the detailed information is conducted only when the desired information is existing in the current summary information recording region, and thus, it becomes possible to reproduce the detained information with increased speed. Thus, even with the information recording media of ultra large-capacity, it becomes possible to reproduce the desired information such as image information or motion picture information at ultra high speed.

As noted heretofore, with the storage device of petabyte class, there is needed a novel technology that provides breakthrough in the trade-off relationship of large storage capacity and high access speed. The fade-in memory proposed in the present invention is a memory that enables to overcome this deadlock situation by combining and fusing the technologies of near-field light, spin cluster and semiconductor integration.

According to the present invention, in which an oscillation mode of plasmon or near-field light is excited in a part of fine particles each including a ferroelectric metal and arrayed in a plane with a minute distance and in which the oscillation mode is caused to propagate through the fine particles, it becomes possible to read out the recorded information recorded in the array of the fine particles in the form of orientation of the magnetic moment of the fine particles, by detecting the change of the oscillation mode of the near-field light and the plasmon caused in the vicinity of the end part of the array of the fine particles. Thereby, it becomes possible to increase the recording density of the information while avoiding the problem of heat generation, or the like, caused when there are provided numerous complex interconnection patterns for improving the recording density and improving the accessibility of information. Thus, the present invention relates to magnetic recording medium that uses near-field optics in combination with nano-structure fine particles that contain ferromagnetic metal and provides an information recording apparatus capable of recording huge amount of information and a method for reproducing information from such an information recording apparatus of huge storage capacity.

According to the present invention, it becomes possible to increase the recording density of ultra large-capacity recording medium of petabyte class, while simultaneously solving the problem of difficulty of retrieving and accessing information at the time of performing recording and reproducing of information with such ultra large-capacity information receding medium. Thus, the present invention provides novel and useful solution of information recording and reproducing processing suitable for high-density recording.

Further, the present invention is by no means limited to the embodiments described heretofore, but various variations and modifications may be made without departing from the scope of the invention.

The present invention is based on Japanese priority applications No. 2006-097583 and 2006-097573 both filed on Mar. 31, 2006, which are incorporated herein as reference.

What is claimed is:

1. A fade-in memory for recording and reproducing information to and from an information recording medium, comprising:
   an information recording unit recording information to a plurality of information recording elements constituting said information recording medium;
   an information reproducing unit reproducing information from said information recording elements;
   an information summarizing unit summarizing information for plural information recording parts, each of said plural information recording parts including a plurality of said information recording elements; and
   a summary information recording unit recording therein a plurality of summary information summarized by said plural information summarizing units.

2. The fade-in memory as claimed in claim 1, further comprising a plurality of second summary information recording parts each summarizing and recording said summary information recorded in a plurality of said first summary information recording parts.

3. The fade-in memory as claimed in claim 1, further comprising a relation information recording part recording information indicative of any of a relationship between said information recording elements constituting said information recording medium, a relationship between said summary information recorded to said plurality of summary information recording parts and a relationship between each information recording elements and each summary information.

4. An information recording method of a fade-in memory, said fade-in memory recording and reproducing information to and from an information recording medium, comprising the steps of:
   recording information to a plurality of information recording elements constituting said information recording medium; and
   recording summary information summarizing said information recorded to said plural information recording elements, to a summary information recording unit provided for said plural information recording elements.

5. The information recording method as claimed in claim 4, wherein summary information summarizing information recorded to each of a plurality of first summary information recording parts is recorded to a second summary information recording part provided for said plurality of said first summary information recording parts.

6. The information recording method as claimed in claim 5, further comprising the step of recording, to a relation information recording part provided for recording information indicative of a relationship between said information recording elements or said summary information recording part constituting said information recording medium, information indicative of any of a relationship between said information recording elements constituting said information recording medium, a relationship between said summary information recorded to said plurality of summary information recording parts and a relationship between each information recording elements and each summary information.

7. An information reproducing method of a fade-in memory recording and reproducing information to and from an information recording medium, said information recording medium comprising a plurality of information recording parts each including a plurality of information recording elements, and a summary information recording unit recording summary information for each of said plural information recording parts, said method comprising the steps of:
   acquiring summary information recorded into a summary information recording unit corresponding to a plurality of information recording elements;
   selecting an information recording element based on said summary information; and
   reproducing information from said selected information recording element.

8. The information reproducing method as claimed in claim 7, further comprising the steps of:
   acquiring second summary information recorded to a second summary information recording part, said second summary information recording part being provided in correspondence to a plurality of said first summary information recording parts, each of said first summary information recording parts recording first summary information summarizing information recorded to a plurality of said information recording elements;

selecting a first summary information recording part corresponding to said second summary information based on said second summary information;

acquiring said first summary information recorded to said selected first summary information recording part; and reproducing information by selecting an information recording element based on said acquired first summary information.

9. The information reproducing method as claimed in claim 7, said fade-in memory further comprising a relation information recording part recording a relationship of said information recording elements or said summary information, said method further comprising the steps of:

acquiring relation information recorded to said relation information recording part indicative of a relationship between said information recording elements and/or between said summary information; and reproducing information by selecting said summary information and/or said information recording elements based on said relationship.

* * * * *